US009178068B1

(12) United States Patent
Cheng et al.

(10) Patent No.: US 9,178,068 B1
(45) Date of Patent: Nov. 3, 2015

(54) FINFET WITH OXIDATION-INDUCED STRESS

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Los Altos, CA (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/613,610

(22) Filed: Feb. 4, 2015

Related U.S. Application Data

(60) Provisional application No. 62/008,011, filed on Jun. 5, 2014.

(51) Int. Cl.
| | |
|---|---|
| *H01L 27/088* | (2006.01) |
| *H01L 29/78* | (2006.01) |
| *H01L 29/66* | (2006.01) |
| *H01L 29/06* | (2006.01) |
| *H01L 21/02* | (2006.01) |

(52) U.S. Cl.
CPC ........ *H01L 29/7851* (2013.01); *H01L 21/0217* (2013.01); *H01L 21/02164* (2013.01); *H01L 21/02238* (2013.01); *H01L 29/0653* (2013.01); *H01L 29/6656* (2013.01); *H01L 29/6681* (2013.01); *H01L 29/7843* (2013.01)

(58) Field of Classification Search
CPC .............. H01L 21/0217; H01L 29/784; H01L 29/7843; H01L 29/0653
USPC .......................................................... 257/401
See application file for complete search history.

(56) References Cited

U.S. PATENT DOCUMENTS

| | | | |
|---|---|---|---|
| 5,721,174 A | 2/1998 | Peidous | |
| 6,800,910 B2 | 10/2004 | Lin et al. | |
| 7,224,033 B2 | 5/2007 | Zhu et al. | |
| 7,307,273 B2 | 12/2007 | Currie | |
| 7,504,704 B2 | 3/2009 | Currie et al. | |
| 7,602,021 B2 | 10/2009 | Doris et al. | |
| 7,709,312 B2 | 5/2010 | Jin et al. | |
| 8,278,175 B2 | 10/2012 | Cheng et al. | |
| 8,828,839 B2 * | 9/2014 | Brunco et al. | ................ 438/400 |
| 2008/0251842 A1 | 10/2008 | Sudo | |
| 2009/0206407 A1 | 8/2009 | Anderson et al. | |
| 2010/0308409 A1 * | 12/2010 | Johnson et al. | ................ 257/368 |

* cited by examiner

*Primary Examiner* — Tuan Nguyen

(74) *Attorney, Agent, or Firm* — Cantor Colburn LLP; Vazken Alexanian

(57) ABSTRACT

A method for inducing stress within the channel of a semiconductor fin structure includes forming a semiconductor fin on a substrate; forming a fin hard mask layer, multiple isolation regions, and multiple spacers, on the semiconductor fin; forming a gate structure on the semiconductor fin; and oxidizing multiple outer regions of the semiconductor fin to create oxidized stressors that induce compressive stress within the channel of the semiconductor fin. A method for inducing tensile stress within the channel of a semiconductor fin by oxidizing a central region of the semiconductor fin is also provided. Structures corresponding to the methods are also provided.

12 Claims, 28 Drawing Sheets

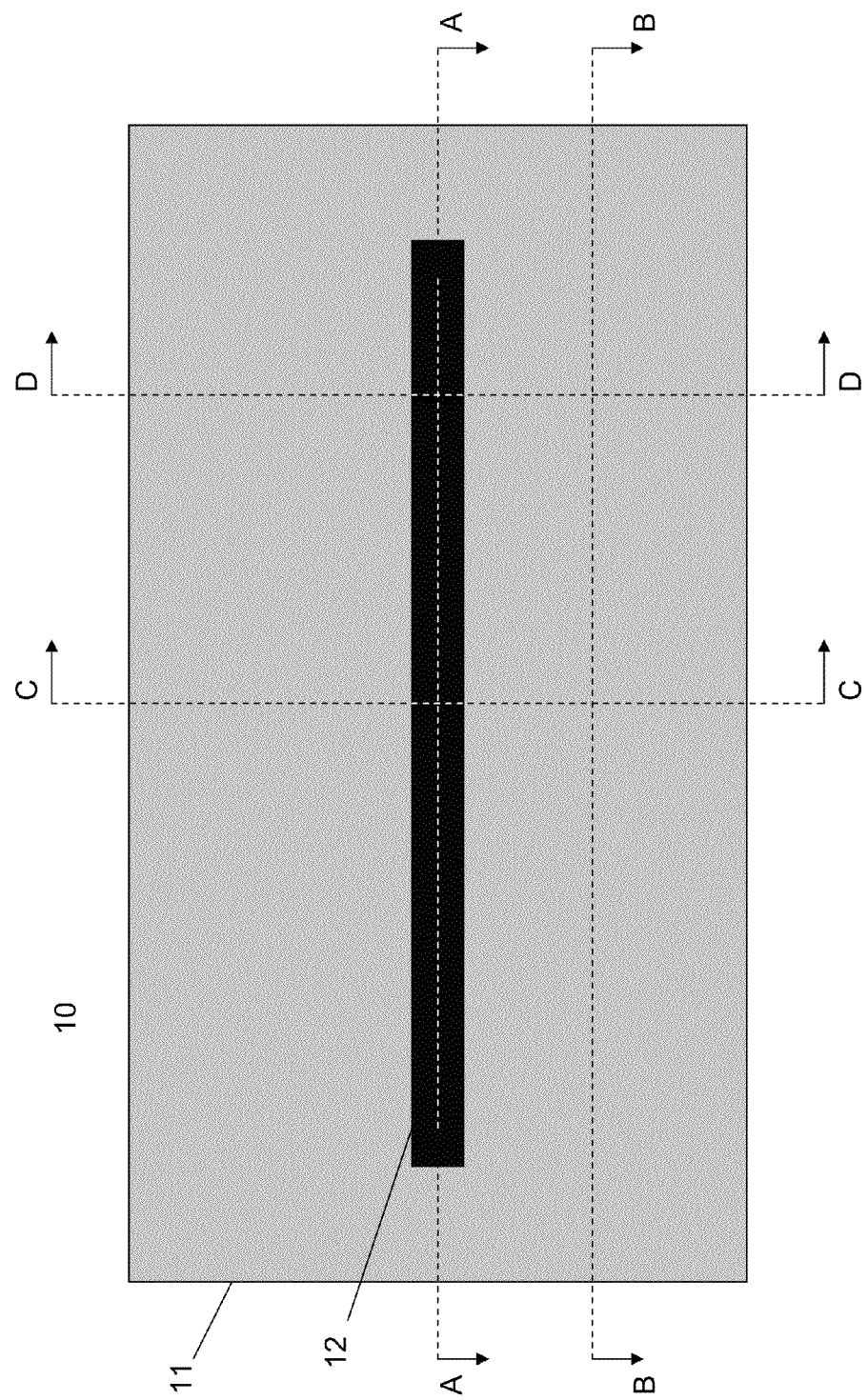

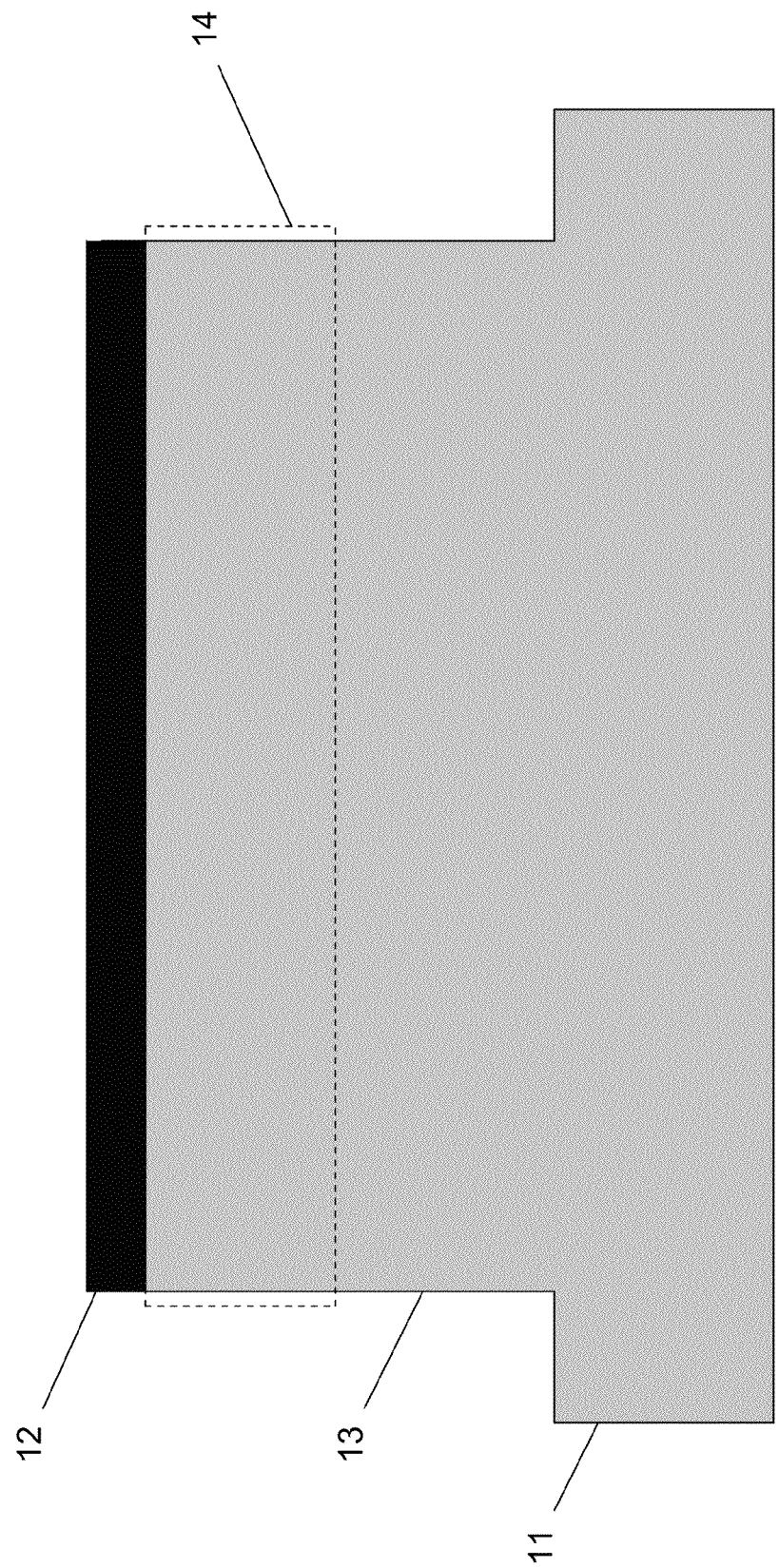

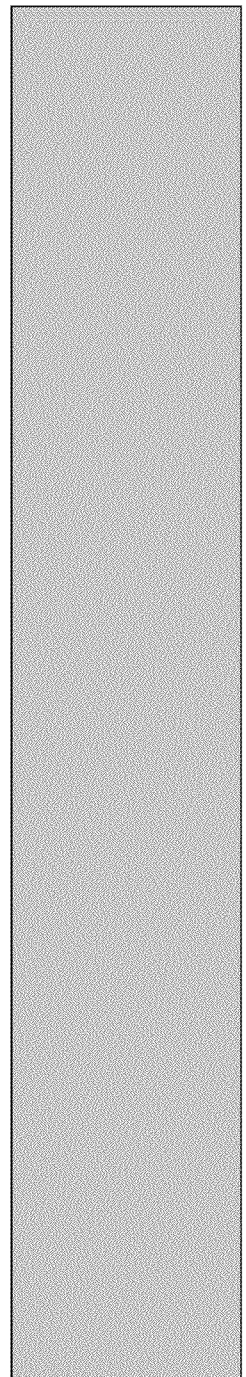
FIG. 1 (B-B)

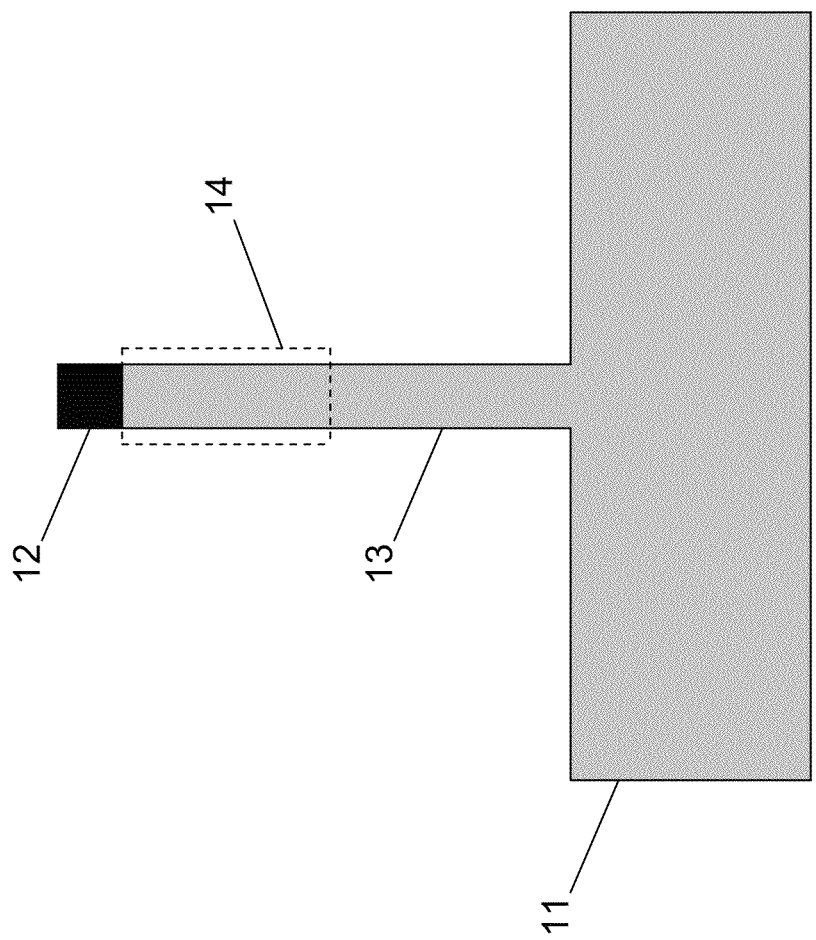

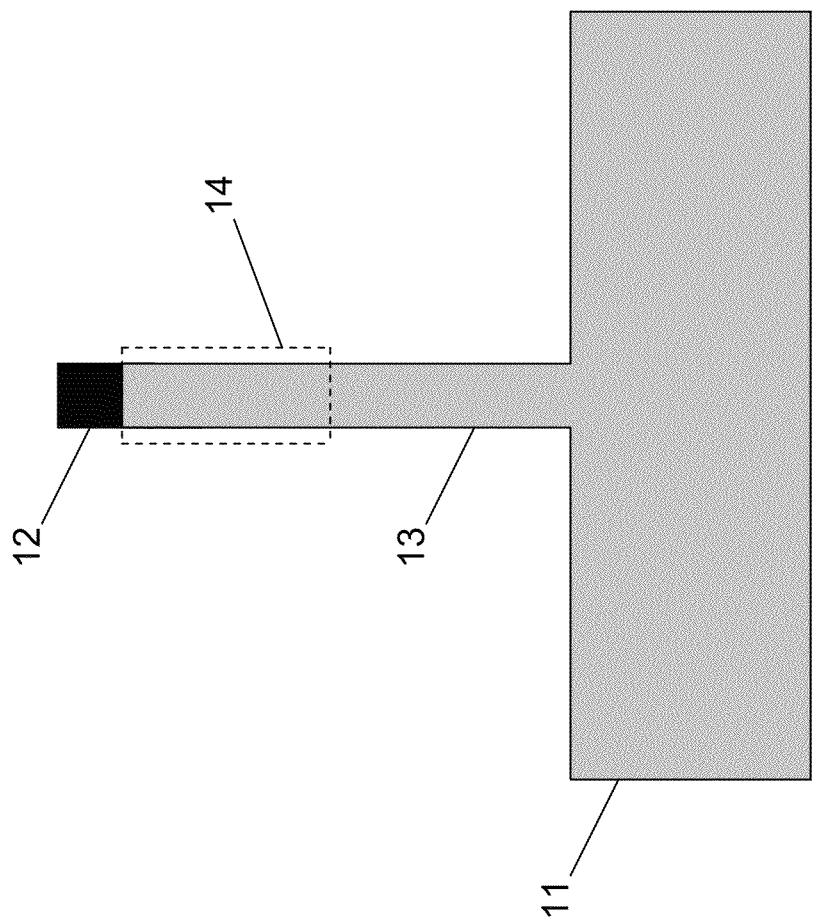

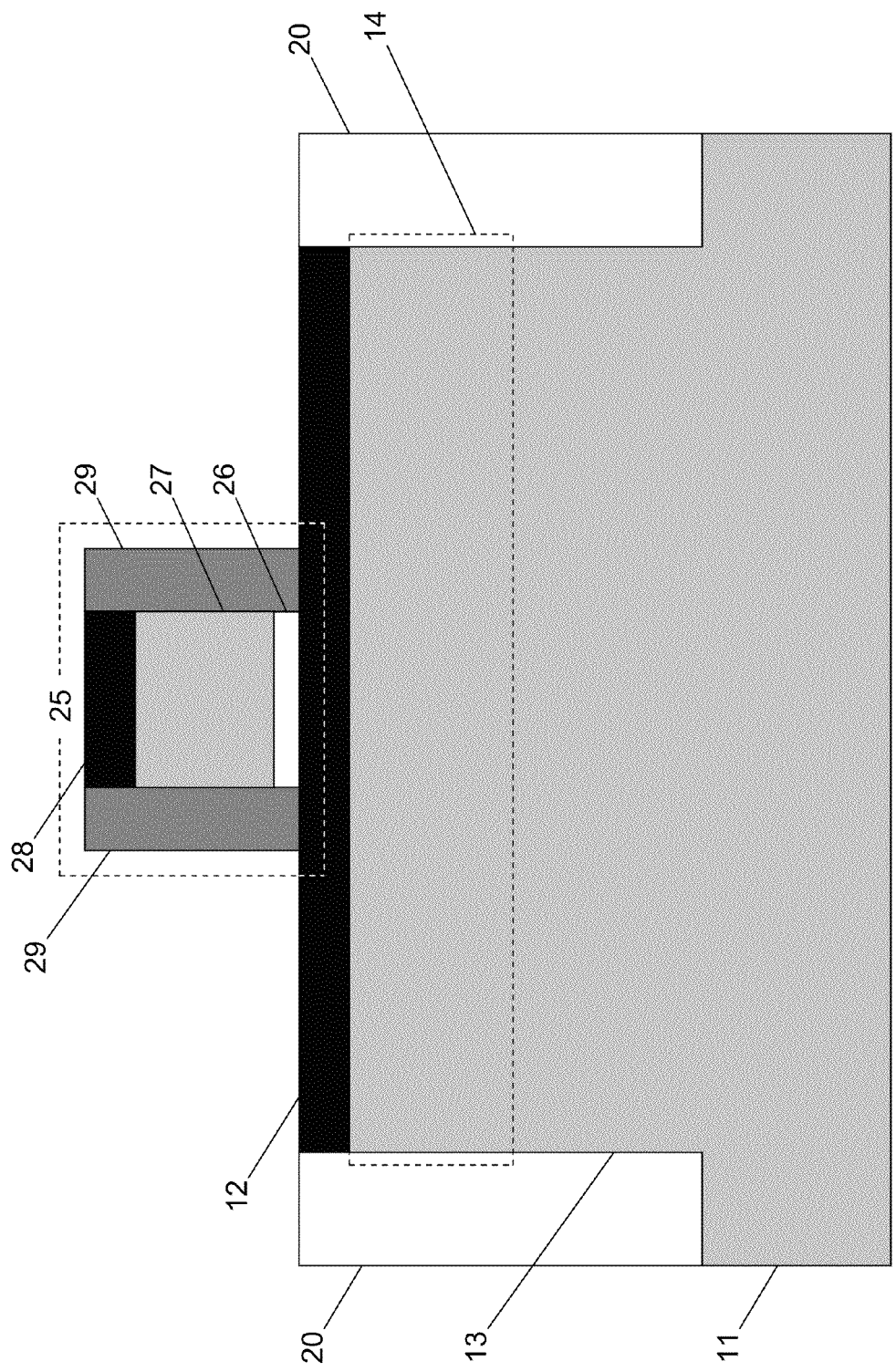
FIG. 2 (A-A)

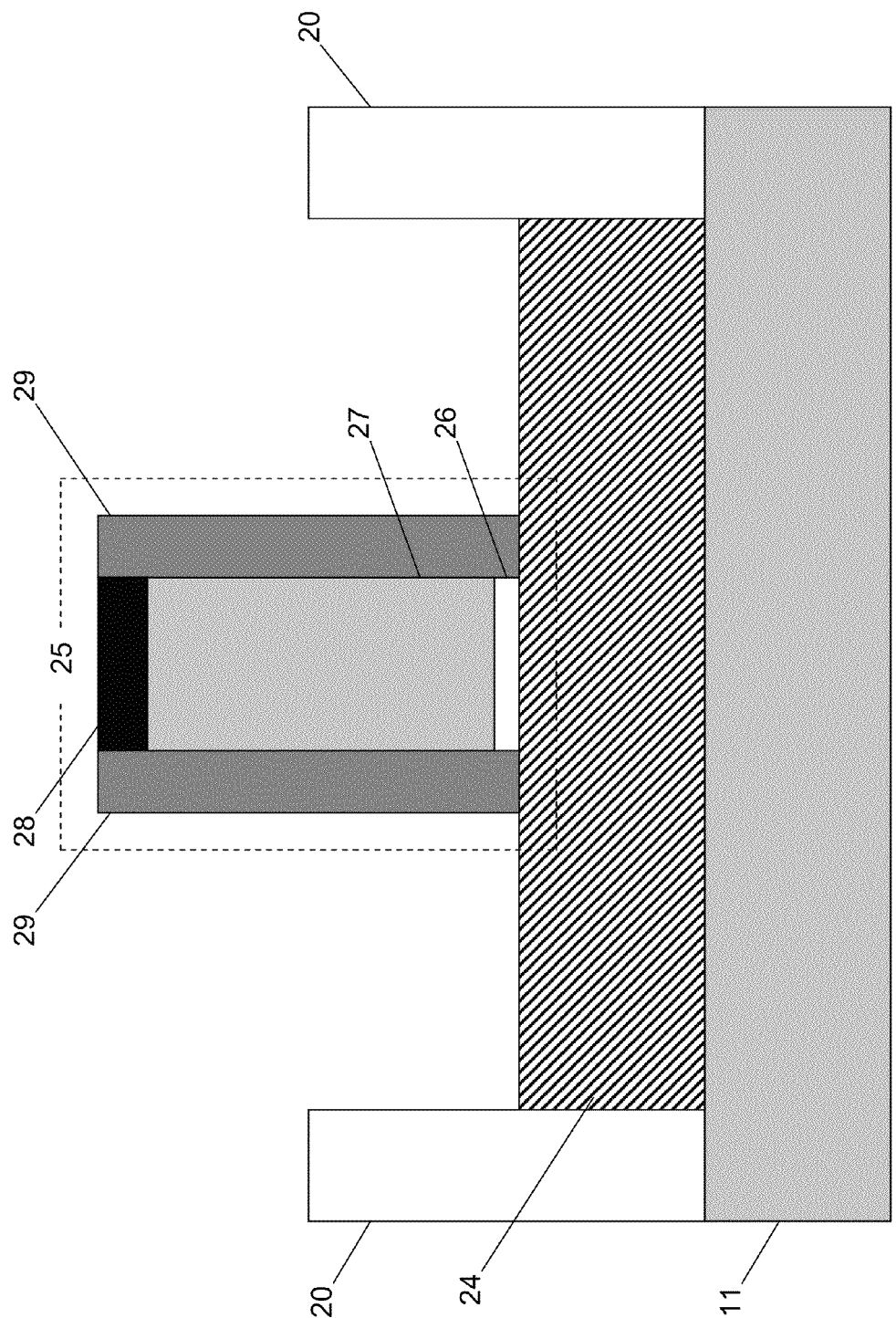
FIG. 2(B-B)

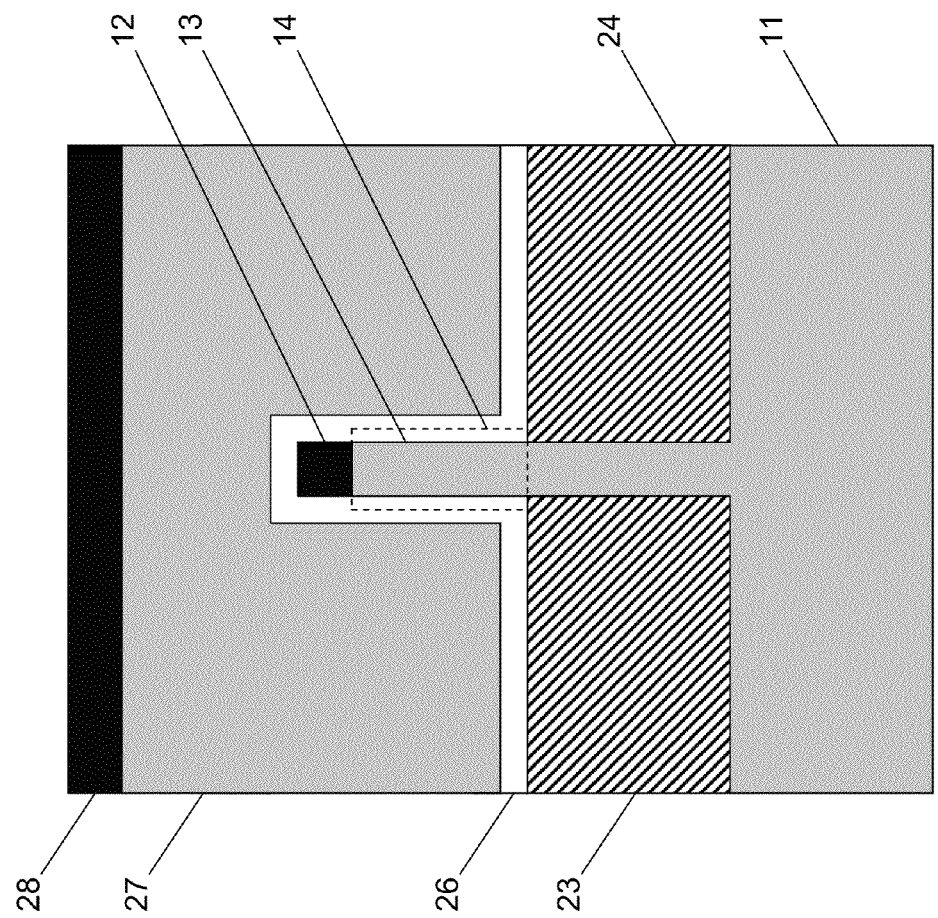

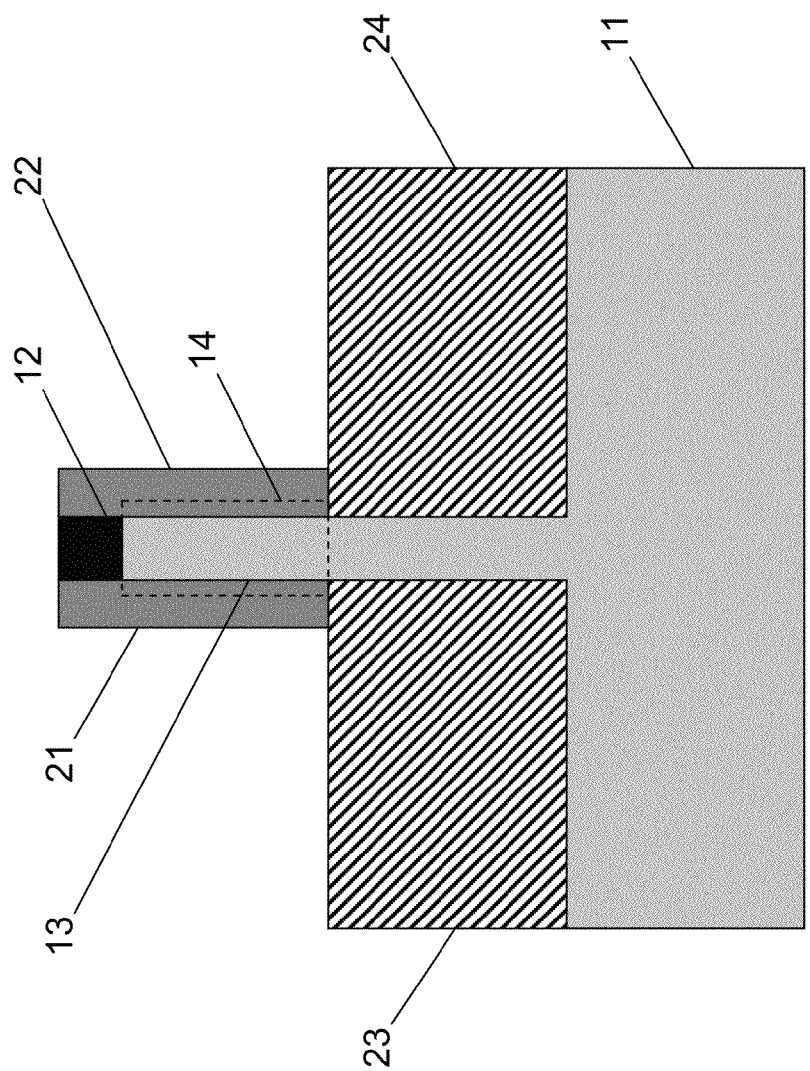
Fig. 2 (D-D)

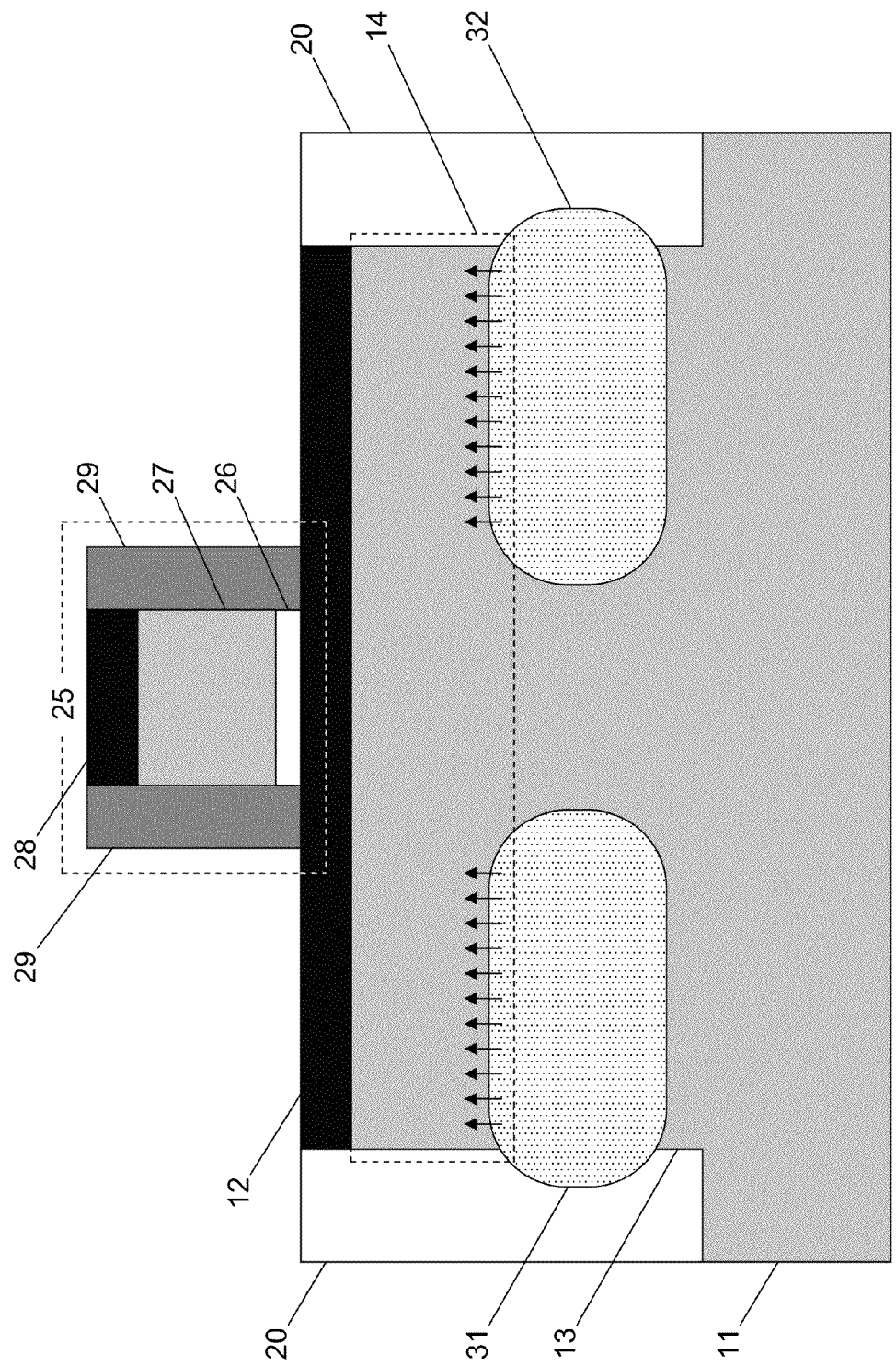
FIG. 3 (A-A)

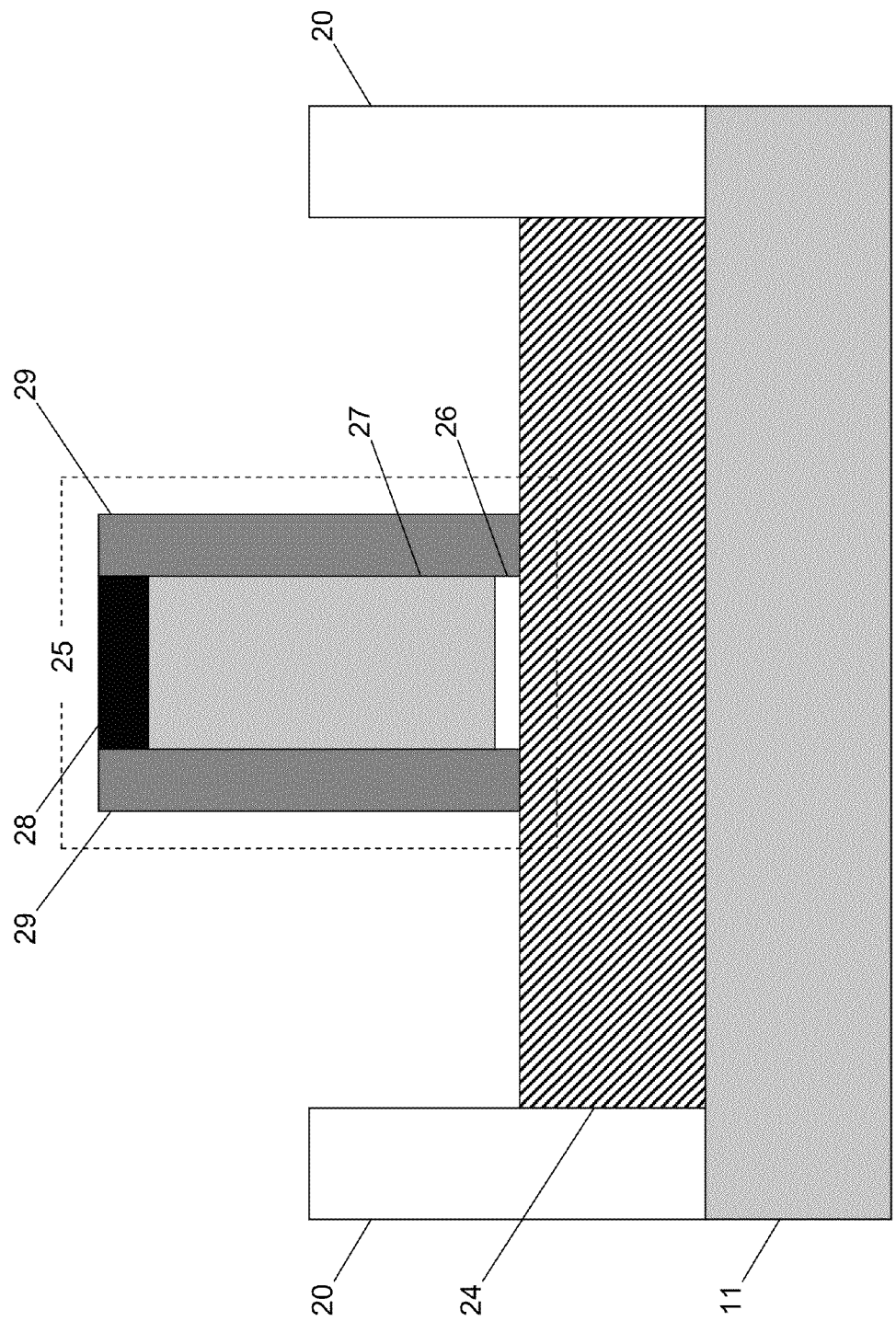

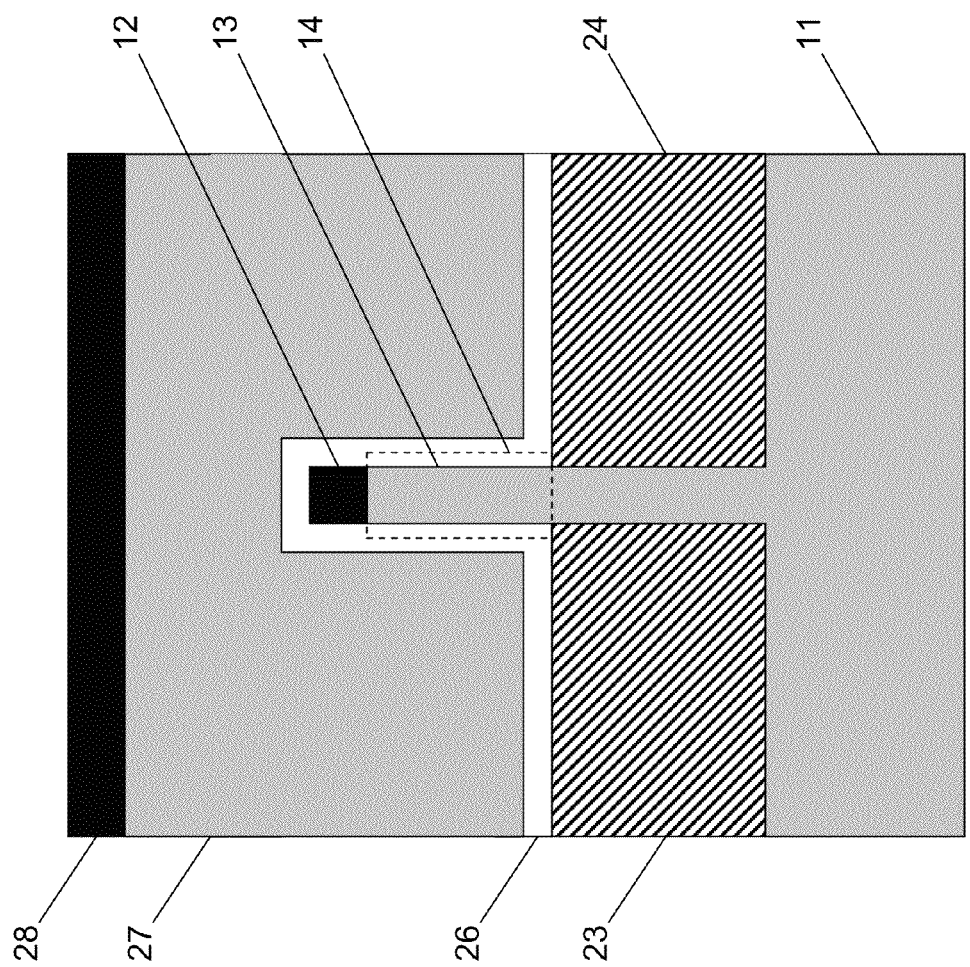

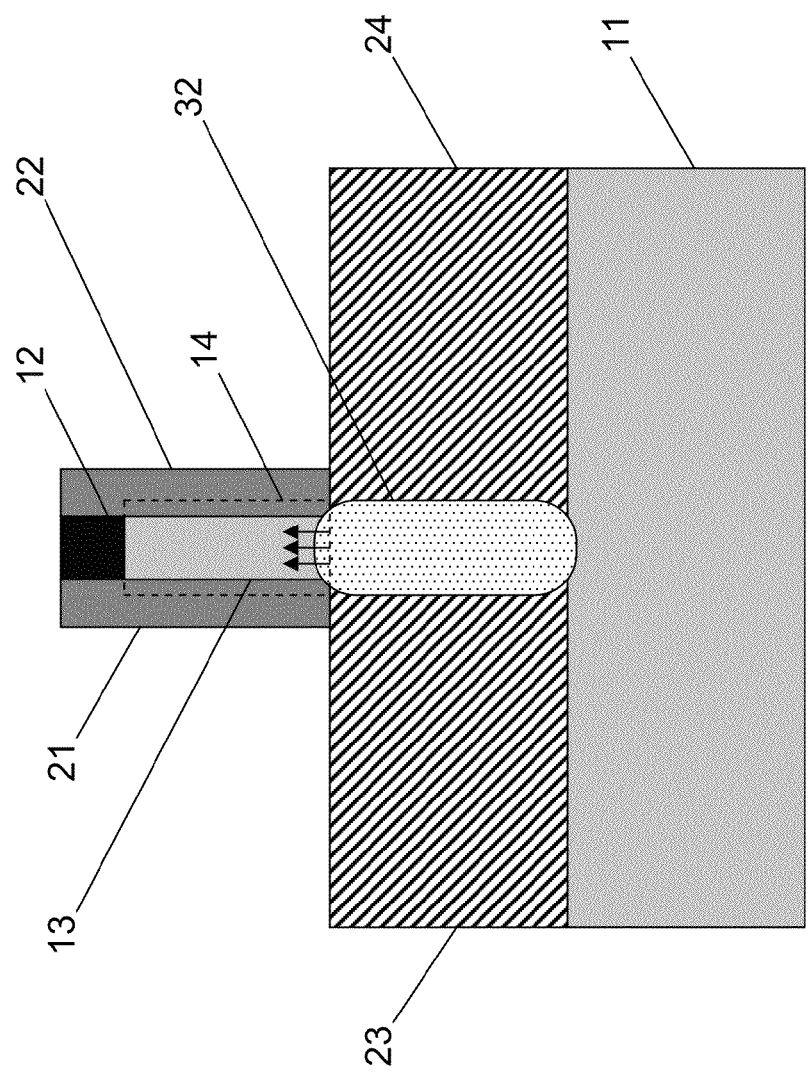
Fig. 3 (D-D)

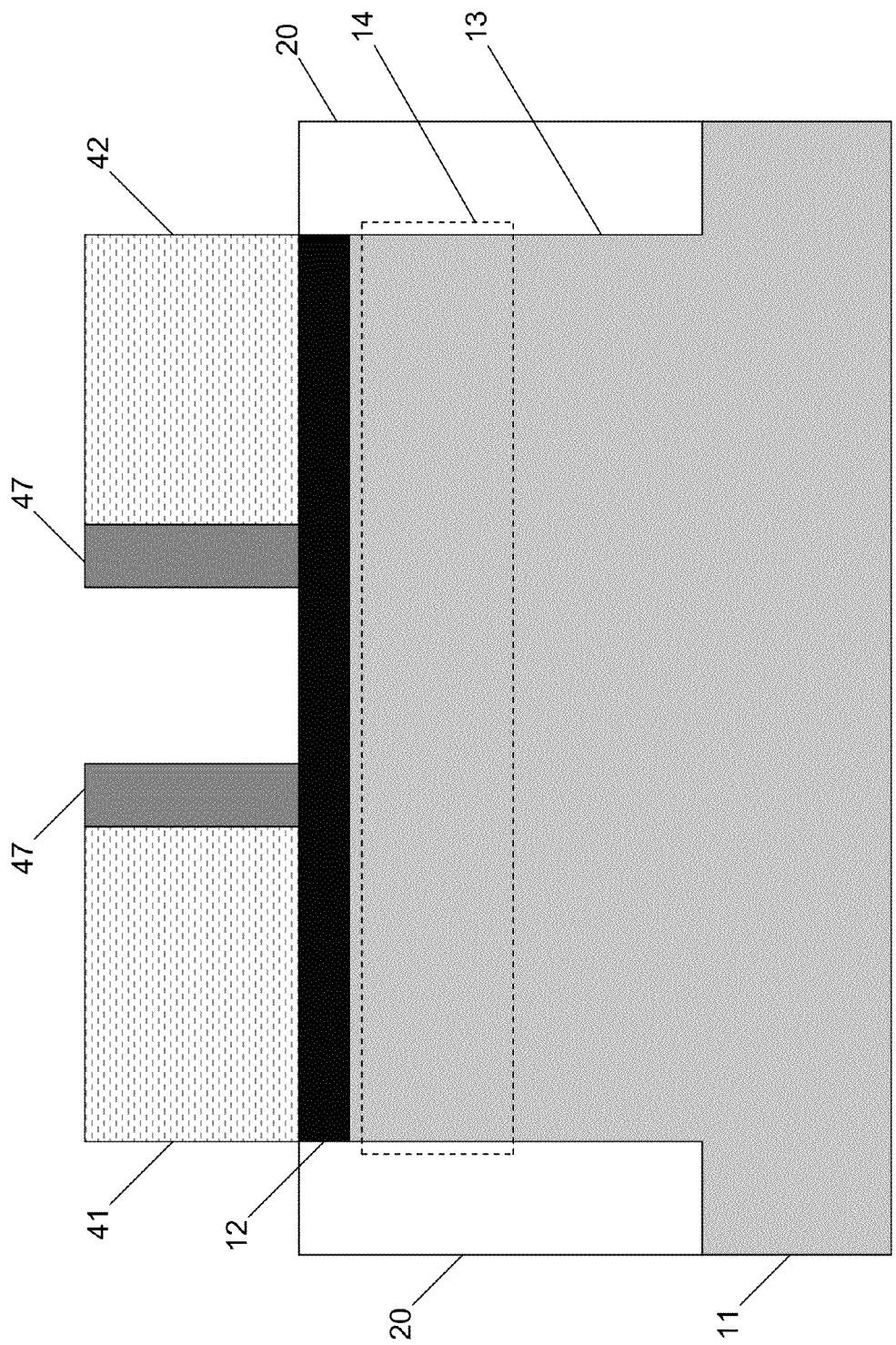
FIG. 4 (A-A)

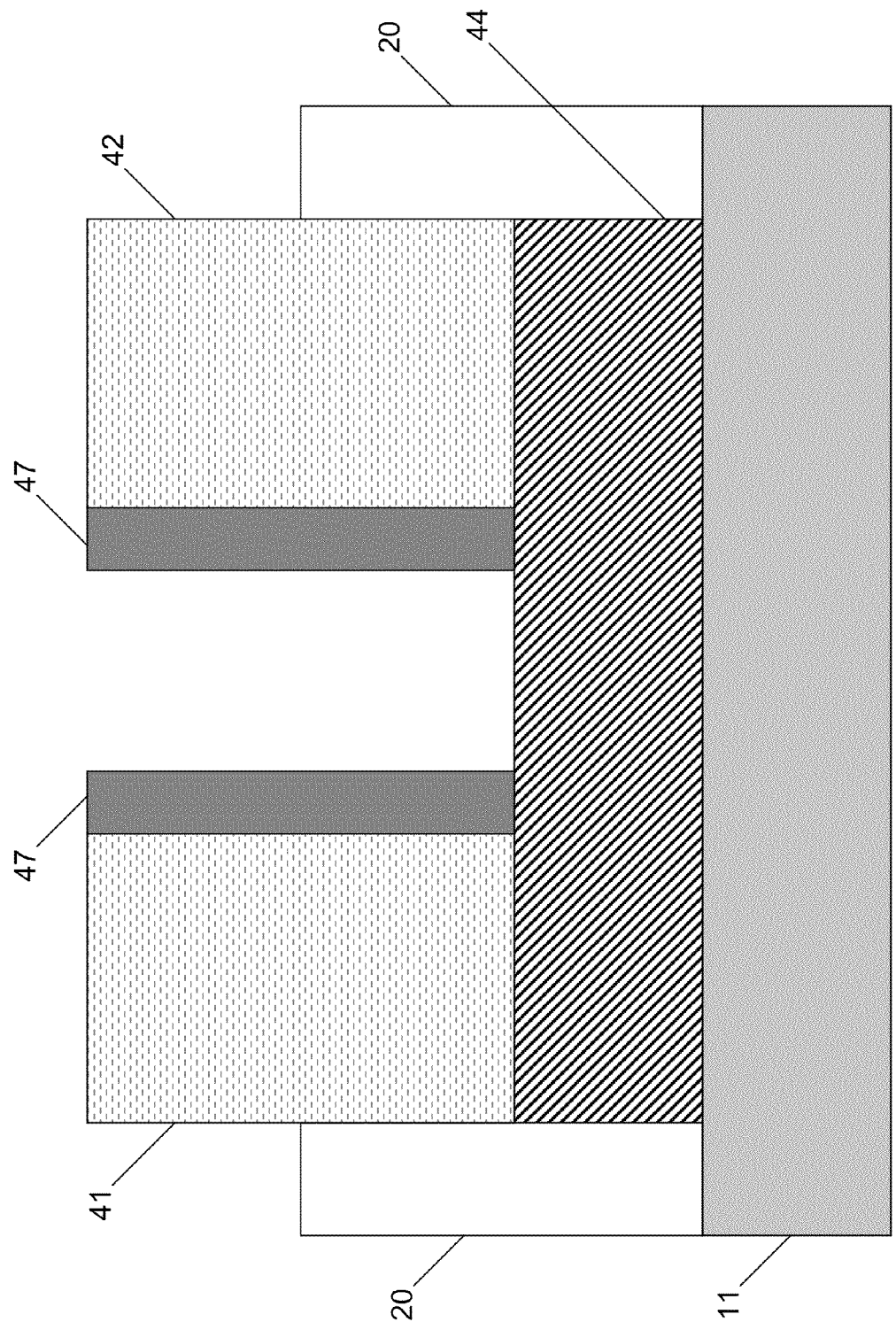
FIG. 4 (B-B)

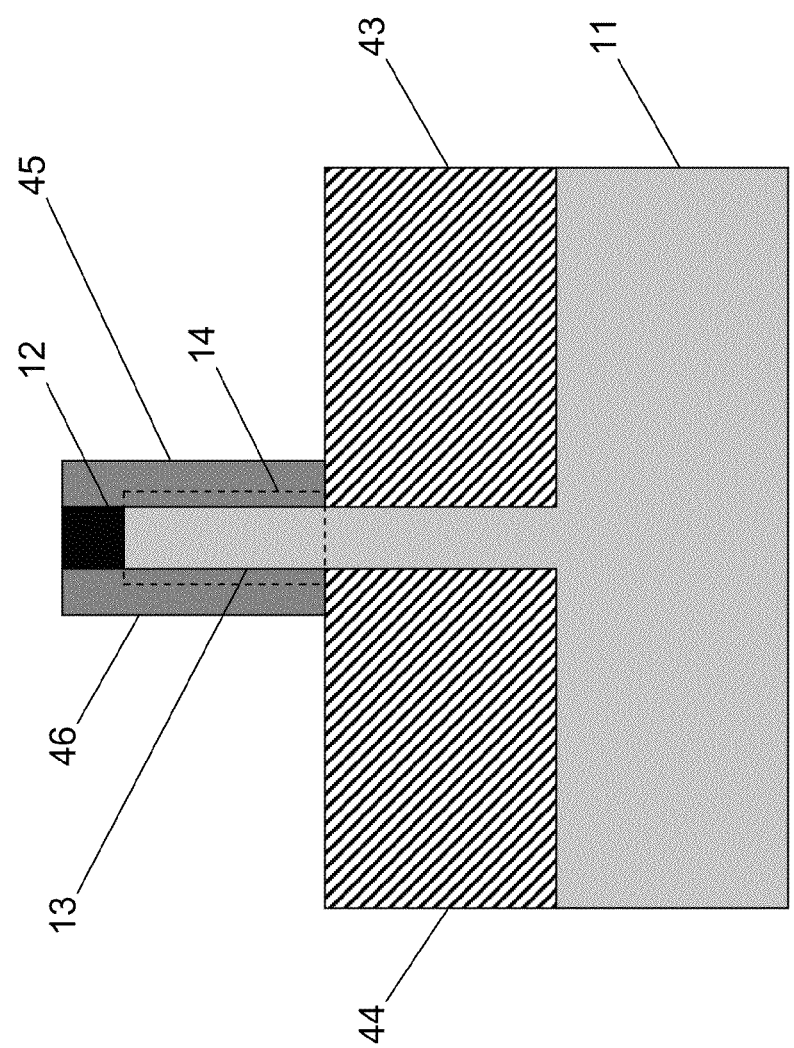
Fig. 4 (C-C)

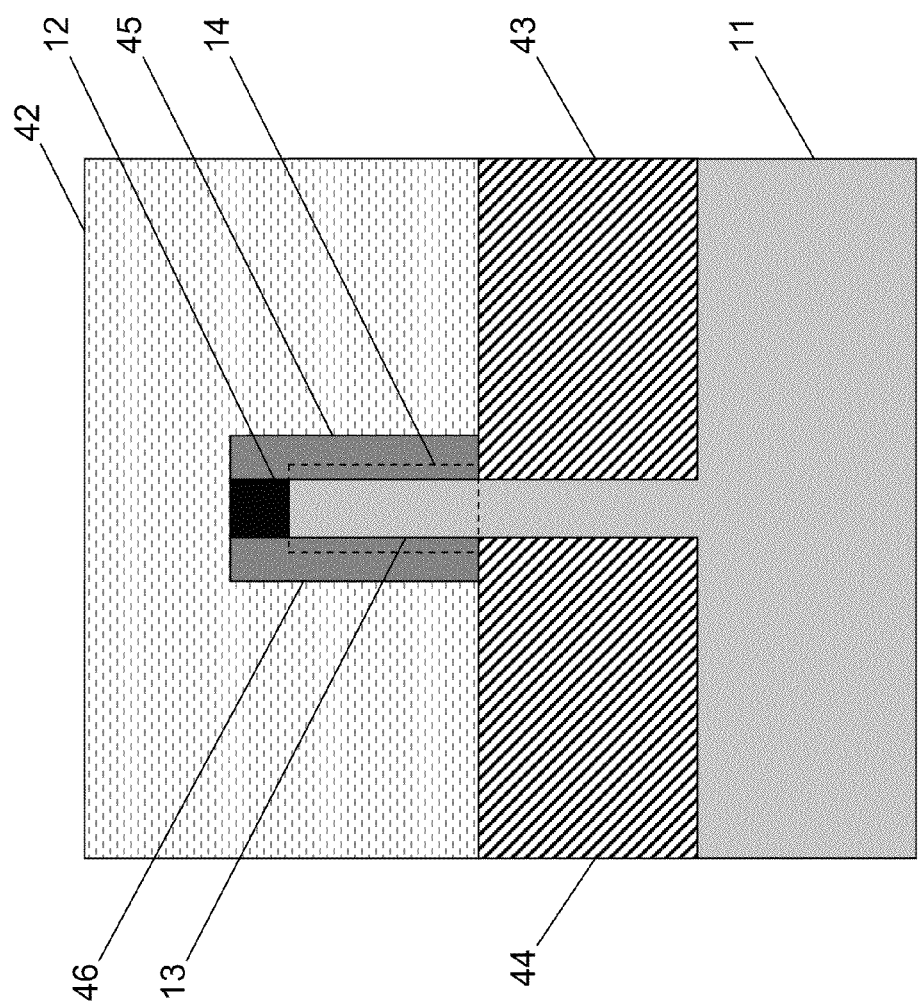
Fig. 4 (D-D)

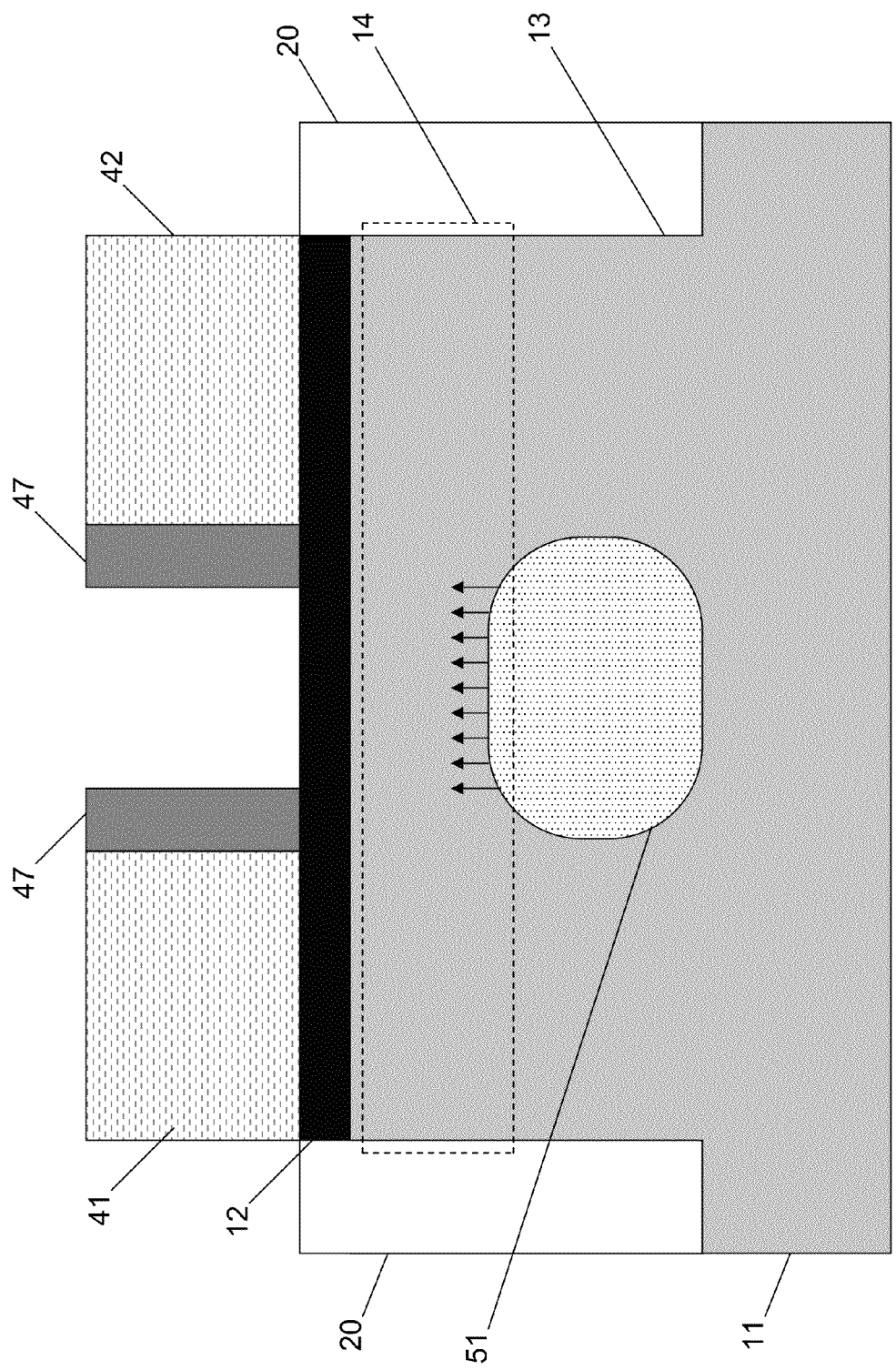
FIG. 5 (A-A)

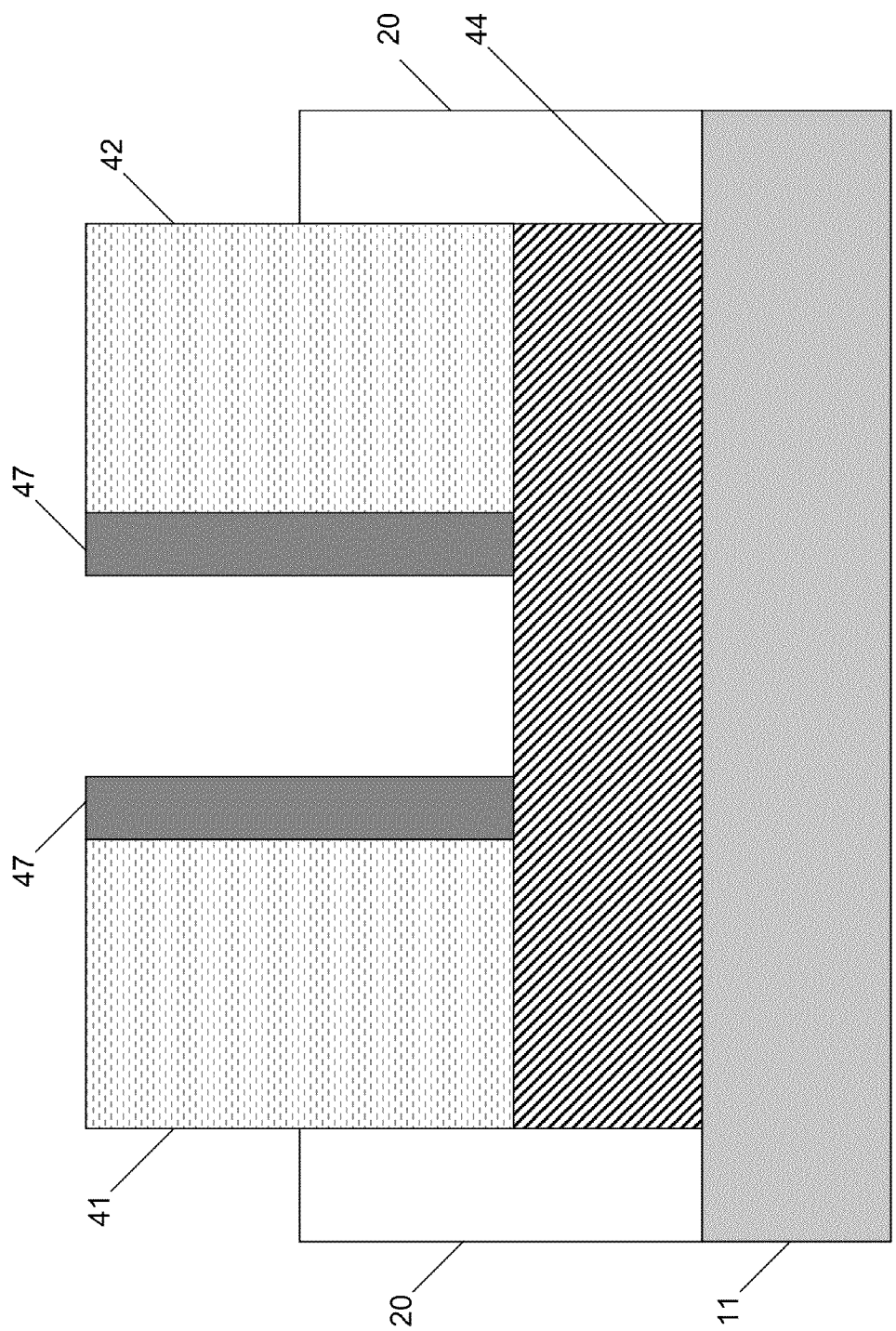
FIG. 5 (B-B)

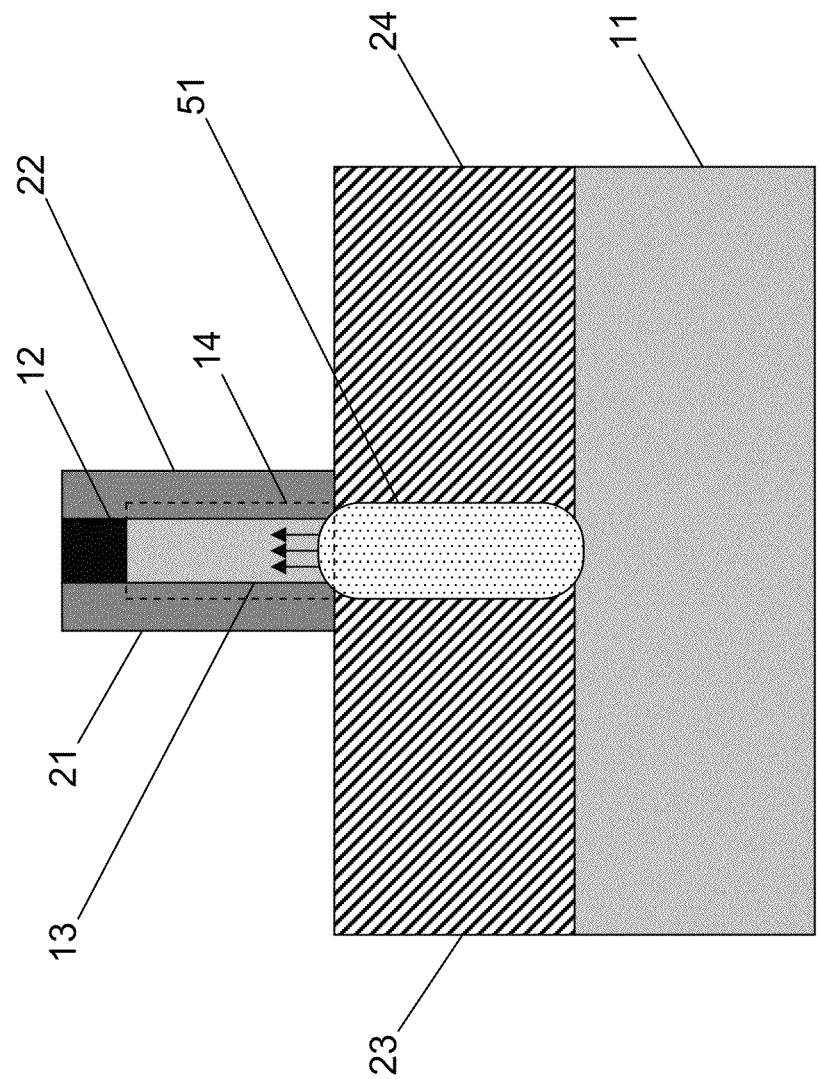
Fig. 5 (C-C)

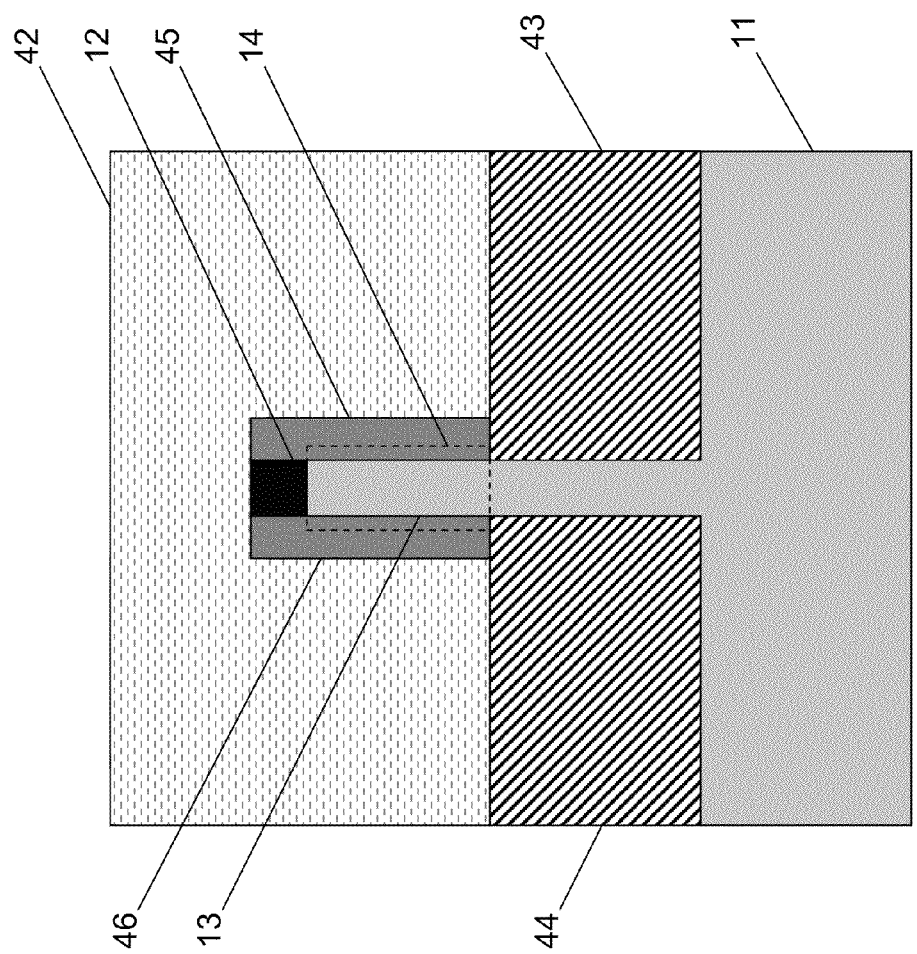
Fig. 5 (D-D)

FINFET WITH OXIDATION-INDUCED STRESS

DOMESTIC PRIORITY

This application claims priority to U.S. Provisional Application No. 62/008,011, entitled "FINFET WITH OXIDATION-INDUCED STRESS," filed Jun. 5, 2014, which is incorporated herein by reference in its entirety.

BACKGROUND

The present invention relates generally to fin field effect transistor structures and methods for fabricating those structures. Particularly, the invention relates to a semiconductor fin structure having oxidation induced stress within the channel of the semiconductor fin and methods for fabricating a semiconductor fin structure having oxidation-induced stress within the channel of the semiconductor fin.

As semiconductor technology continues to advance and semiconductor device and structure dimensions continue to decrease, the utilization of field effect transistor (FET) devices of the fin type rather than planar-type has increased. A fin-FET device is characterized by a semiconductor fin that is positioned perpendicularly with respect to a semiconductor substrate, to provide a vertical channel within the fin-FET device. This vertical channel, rather than an exclusively planar channel characteristic of a planar-FET device, is covered with a gate structure.

The performance of a modern microelectronic device is highly dependent on the collective speed of the FETs found within the device's integrated circuits. One factor that affects the speed of a FET is carrier mobility, which determines the flow of electric current through the FET's channel between the source and drain. Consequently, improving the carrier mobility of the FETs within a microelectronic device's integrated circuits enhances the device's performance. One method to increase the carrier mobility in a FET is trough applying mechanical stress to the channel of the FET.

Field Effect Transistors (FETs), which lay at the core of an integrated circuit, typically are characterized by being of a hole conduction type, called pFET, or being of an electron conduction type, called nFET. And just as the conduction type differs between an nFET and a pFET, the methods for increasing carrier mobility with them differs. Accordingly, in order to maximize the performance of both nFETs and pFETs within integrated circuit devices, the stress components should be engineered and applied differently for nFETs and pFETs because the type of stress that benefits the performance of an nFETs is generally disadvantageous for the performance of pFETs. More particularly, when a device is in tension the performance characteristics of an nFET are enhanced while the performance characteristics of a pFET are diminished.

To selectively create tensile stress in nFETs and compressive stress in pFETs, distinctive processes and different combinations of materials are used. For example, liners on gate sidewalls have been utilized to selectively induce the appropriate stress in the channels of the FET devices. By providing liners the appropriate strain is applied to the device. While this method does provide tensile stresses to nFET devices and compressive stresses along the longitudinal direction of pFET devices, they can require additional materials and more complex processing, and consequently are more expensive. Further, the stresses that can be applied utilizing liners are typically limited to moderate levels (i.e. on the order of 100 s of MPa).

A method that has been implemented to increase the stress levels in a fin-FET device, is the creation of silicon-germanium (SiGe) lattice layers. When epitaxially grown on silicon, an unrelaxed SiGe layer will have a lattice constant that conforms to that of the silicon substrate. Upon relaxation though, the SiGe lattice constant approaches that of its intrinsic lattice constant which is larger than that of silicon. Accordingly, when a silicon layer is epitaxially grown thereon, the silicon layer conforms to the larger lattice constant of the relaxed SiGe layer which results in expansion via a physical biaxial stress to the silicon layer. This physical stress applied to the silicon layer is beneficial to nFET devices but degrades the performance of pFET devices.

Another method of inducing stress within the channel of a fin-FET device utilizes embedded stressor materials epitaxially formed in the source/drain regions of the device. The source/drain regions of the device are recessed while the channel is protected by the gate and spacers and a semiconductor with lattice constant different from that of the fin is epitaxially grown in the recess. If a semiconductor with equilibrium lattice constant larger than that of the fin is used, compressive stress is applied to the channel. Similarly, if a semiconductor with equilibrium lattice constant smaller than that of the fin is used, tensile stress is applied to the channel. Typically, SiGe and Si:C are used to apply compressive and tensile stress, respectively, to a Si channel.

However, as the transistor pitch is made smaller to obtain higher device density in advanced CMOS technologies, the volume available to form embedded source/drain stressors becomes smaller. Consequently, the amount of stress that can be applied to the channel of the transistor is reduced. Also, the three-dimensional structure of the fin-FET results in non-uniform stress distribution in the channel of the fin-FET. Typically, with embedded source/drain stressors maximum amount of stress is obtained at the top of the fin, where as stress is negligible at the bottom of the fin. So, there is a need to new stressor elements that are more efficient in inducing stress to the channel of Fin-FET devices.

SUMMARY

The present invention provides a method for constructing a semiconductor fin structure having a compressive stressed channel, the method includes the steps of: forming a semiconductor fin on a substrate; forming a fin hard mask layer on a top surface of the semiconductor fin; forming a first isolation region on a lower portion of a first side wall of the semiconductor fin; forming a second isolation region on a lower portion of a second side wall of the semiconductor fin; forming a first fin spacer on an upper portion of the first side wall of the semiconductor fin; forming a second fin spacer on an upper portion of the second side wall of the semiconductor fin; forming a gate structure on a center portion of the semiconductor fin; oxidizing a first lower outer region of the semiconductor fin through the width of the fin to create a first oxide stressor that is separated from the top surface of the semiconductor fin by an upper portion of the semiconductor fin; and oxidizing a second lower outer region of the semiconductor fin through the width of the semiconductor fin to create a second oxide stressor that is separated from the top surface of the semiconductor fin by an upper portion of the fin, and separated from the first stressor by the center portion of the semiconductor fin; where, oxidizing the first lower outer region causes the first lower outer region to expand thereby forming the first oxide stressor, which exerts vertical pressure on the upper portion of the semiconductor fin directly above the first stressor; where, oxidizing the second lower outer region causes the second lower outer region to expand thereby forming the second oxide stressor, which exerts vertical pressure on the upper portion of the semiconductor fin directly above the second stressor; and where, the first oxide stressor and the second oxide stressor collectively induce compressive stress within a channel of the semiconductor fin.

The present invention also provides a semiconductor fin structure having a compressive stressed channel, having: a semiconductor fin having a channel; a first oxide stressor formed through the width of the semiconductor fin, separated from a top surface of the semiconductor fin by an upper portion of the semiconductor fin; and a second oxide stressor formed through the width of the semiconductor fin, separated from a top surface of the semiconductor fin by an upper portion of the semiconductor fin, and separated from the first oxide stressor by a center portion of the semiconductor fin; wherein, the first stressor exerts vertical pressure on the upper portion of the semiconductor fin directly above the first stressor, and the second stressor exerts vertical pressure on the upper portion of the semiconductor fin directly above the second stressor, such that the first stressor and the second stressor collectively induce compressive stress within the channel of the semiconductor fin.

The present invention additionally provides a method for constructing a semiconductor fin structure having a tensile stressed channel, the method includes the steps of: forming a semiconductor fin on a substrate; forming a fin hard mask layer on a top surface of the fin; forming a first isolation region on a lower portion of a first side wall of the semiconductor fin; forming a second isolation region on a lower portion of a second side wall of the semiconductor fin; forming a first fin spacer on an upper portion of the first side wall of the semiconductor fin; forming a second fin spacer on an upper portion of the second side wall of the semiconductor fin; forming a dummy gate structure on a center portion of the semiconductor fin; forming a first inter-layer dielectric on a first outer portion of the semiconductor fin; forming a second inter-layer dielectric on a second outer portion of the semiconductor fin; removing the dummy gate structure from the center portion of the semiconductor fin; and oxidizing a lower central region of the semiconductor fin through the width of the semiconductor fin to create an oxide stressor that is separated from the top surface of the semiconductor fin by an upper portion of the semiconductor fin, separated from a first end of the semiconductor fin by a first outer region of the semiconductor fin, and separated from a second end of the semiconductor fin by a second outer region of the semiconductor fin; where, oxidizing the lower center region causes the lower center region to expand thereby forming the oxide stressor, which exerts pressure on the upper portion of the semiconductor fin directly above the oxide stressor; and where the oxide stressor induces tensile stress within a channel of the semiconductor fin.

The present invention further provides a semiconductor fin structure having a tensile stressed channel, including: a semiconductor fin having a channel; and an oxide stressor formed through the width of the semiconductor fin, separated from a top surface of the semiconductor fin by an upper portion of the semiconductor fin, separated from a first end of the semiconductor fin by a first outer portion of the semiconductor fin, and separated from a second end of the semiconductor fin by a second outer portion of the semiconductor fin; wherein, the oxide stressor exerts vertical pressure on the upper portion of the semiconductor fin directly above the stressor such that the stressor induces tensile stress within the channel of the semiconductor fin.

BRIEF DESCRIPTION OF THE DRAWINGS

FIG. 1 illustrates a top view of an initial semiconductor fin structure.

FIG. 1(A-A) illustrates a cross section through the fin of the initial semiconductor fin structure of FIG. 1.

FIG. 1(B-B) illustrates a cross section parallel to the fin through the trench region of the initial semiconductor fin structure of FIG. 1.

FIG. 1(C-C) illustrates a cross section normal to the fin through the gate region of the initial semiconductor fin structure of FIG. 1.

FIG. 1(D-D) illustrates a cross section normal to the fin through the source-drain region of the semiconductor fin structure of FIG. 1.

FIG. 2(A-A) illustrates a cross section through the fin of the intermediate semiconductor fin structure of FIG. 2.

FIG. 2(B-B) illustrates a cross section parallel to the fin through the trench region of the intermediate semiconductor fin structure of FIG. 2.

FIG. 2(C-C) illustrates a cross section normal to the fin through the gate region of the intermediate semiconductor fin structure of FIG. 2.

FIG. 2(D-D) illustrates a cross section normal to the fin through the source-drain region of the intermediate semiconductor fin structure of FIG. 2.

FIG. 3(A-A) illustrates a cross section through the fin of the semiconductor fin structure of FIG. 3, which has had multiple oxide stressors formed within the outer regions of the fin of the intermediate semiconductor structure FIG. 2.

FIG. 3(B-B) illustrates a cross section parallel to the semiconductor fin through the trench region of the semiconductor fin structure of FIG. 3, which has had multiple oxide stressors formed within the outer regions of the fin of the intermediate semiconductor structure FIG. 2.

FIG. 3(C-C) illustrates a cross section normal to the fin through the gate region of the semiconductor fin structure of FIG. 3, which has had multiple oxide stressors formed within the outer regions of the fin of the intermediate semiconductor structure FIG. 2.

FIG. 3(D-D) illustrates a cross section normal to the fin through the source-drain region of the semiconductor fin structure of FIG. 3, which has had multiple oxide stressors formed within the outer regions of the fin of the intermediate semiconductor structure FIG. 2.

FIG. 4(A-A) illustrates a cross section through the fin of the intermediate semiconductor fin structure of FIG. 4.

FIG. 4(B-B) illustrates a cross section parallel to the fin through the trench region of the intermediate semiconductor fin structure of FIG. 4.

FIG. 4(C-C) illustrates a cross section normal to the fin through the gate region of the intermediate semiconductor fin structure of FIG. 4.

FIG. 4(D-D) illustrates a cross section normal to the fin through the source-drain region of the intermediate semiconductor fin structure of FIG. 4.

FIG. 5(A-A) illustrates a cross section through the fin of the semiconductor fin structure of FIG. 5 following formation of an oxide stressor within a central portion of the fin of the intermediate semiconductor structure of FIG. 4, thereby inducing tensile stress within the channel of the fin.

FIG. 5(B-B) illustrates a cross section parallel to the fin through the trench region of the semiconductor fin structure of FIG. 5 following formation of an oxide stressor within a central portion of the fin of the intermediate semiconductor structure of FIG. 4, thereby inducing tensile stress within the channel of the fin.

FIG. 5(C-C) illustrates a cross section normal to the fin through the gate region of the semiconductor fin structure of FIG. 5 following formation of an oxide stressor within a central portion of the fin of the intermediate semiconductor structure of FIG. 4, thereby inducing tensile stress within the channel of the fin.

FIG. 5(D-D) illustrates a cross section normal to the fin through the source-drain region of the semiconductor fin structure of FIG. 5 following formation of an oxide stressor within a central portion of the fin of the intermediate semiconductor structure of FIG. 4, thereby inducing tensile stress within the channel of the fin.

DETAILED DESCRIPTION

Figure 2:
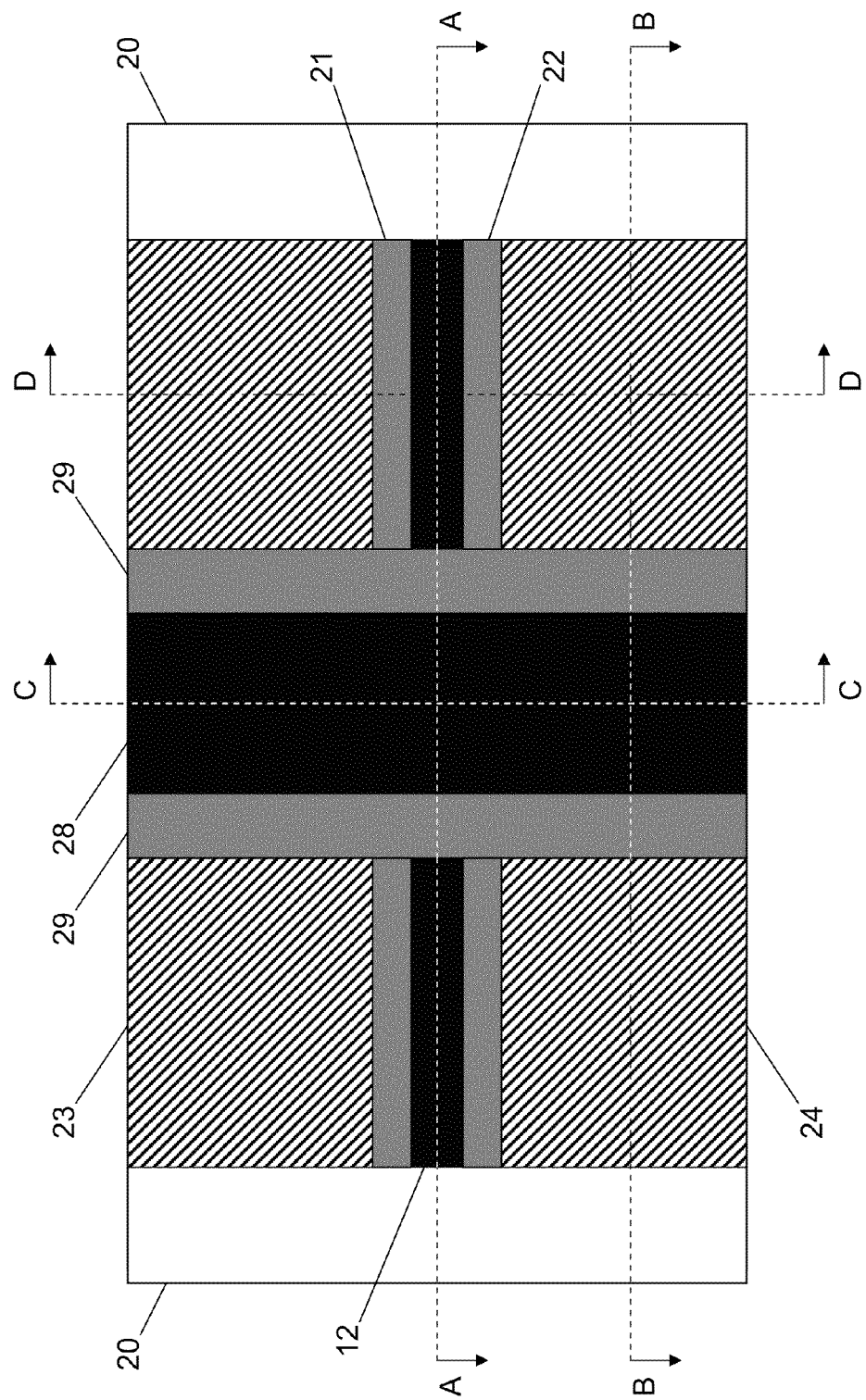
FIG. 2 illustrates a top view of an intermediate semiconductor fin structure of the present invention following the formation of shallow trench isolation regions, outer isolation regions, fin spacers and a gate structure on the initial semiconductor fin structure of FIG. 1.

It will be readily understood that the components of the present invention, as generally described and illustrated in the figures herein, can be arranged and designed in a wide variety of different configurations in addition to the described presently preferred embodiments. Thus, the following detailed description of the embodiments of the present invention, as represented in the figures, is not intended to limit the scope of the invention, as claimed, but is merely representative of selected presently preferred embodiments of the invention. The following description is intended only by way of example, and simply illustrates certain selected presently preferred embodiments of the invention as claimed herein.

The invention, which includes finFET structures and methods for fabricating the finFET structures, is to be understood within the context of the description provided below. The description provided below is to be understood within the context of the drawings provided and described above. The drawings are intended for illustrative purposes and as such are not necessarily drawn to scale.

While the instant embodiment illustrates the invention within the context of a bulk semiconductor substrate, the embodiment is not intended to be so limited. Rather, under certain circumstances the embodiment and the invention can also be practiced within the context of semiconductor-on-insulator substrates and hybrid orientation substrates.

Fabricating semiconductor devices containing stressed fin-FETs typically requires additional layers of material or additional material structures to induce the stress within the channel of the fin-FET. Such fabrication techniques are often specific to one type of stress, either tension or compression, and as a result processes and materials are needed to create tensile stress while different processes and materials are needed in order to create compressive stress. As a result, integrated circuits utilizing both tensile and compressive stressed fin-FETs require complex fabrication methods and increase costs to produce. Furthermore, some methods known in art do not produce uniform stress within the affected fin-FETs, which ultimately causes the resulting stresses to be unpredictable.

Embodiments of the present invention teach fabrication methods for inducing compressive or tensile stresses within the channel of semiconductor fin-FET devices in a way that is predictable and does not require vastly different techniques for creating tensile stresses and compressive stresses. Furthermore, the footprint of the resulting structure is not increased and consequently the transistor density within the integrated circuit is not affected.

The present invention allows for the carrier mobility of the affected FETs to be increased by selecting materials for layering on the nFET and pFET devices, subjecting the materials to rapid thermal oxidation, and doing so in ways that cause only the desired regions of the fin to be oxidized. By selectively oxidizing specific areas of the fin, only those areas oxidized expand in volume and exert pressure vertically to induce either compressive or tensile stress within the channel of the fin.

Reference is first made to FIGS. 1-1(D-D) which illustrates an initial semiconductor structure of the present invention. It is emphasized that in the drawings of the present application, the semiconductor structures include at least one semiconductor fin. The present invention is not intended to be limited to application to single fin-FETs, and can be applied to fin arrays made of multiple semiconductor fins to produce both stressed nFETs and stressed pFETs.

Referring to FIG. 1, a top down view of an initial semiconductor structure for an embodiment of the present invention is illustrated, including a semiconductor structure 10 having a substrate 11 with at least one fin disposed on substrate 11 with the fin capped with a fin hard mask layer 12. Four cross sections A-A, B-B, C-C, and D-D are shown in FIG. 1 and will be utilized to describe embodiments of the present invention.

Referring to FIG. 1(A-A), a cross section of the initial semiconductor structure 10 of FIG. 1 is shown, taken through the fin 13 of the semiconductor structure. The fin 13 is disposed on the substrate 11 and has a hard mask layer 12 disposed on a top surface of the fin 13. Also shown, is the intended channel region 14 of the fin 13 once subsequent steps are taken to create a fin-FET device.

Referring to FIG. 1(B-B), a cross section of the initial semiconductor structure of FIG. 1 is shown, taken parallel to the fin 13, through the intended trench region of the resulting fin-FET device. FIG. 1(B-B) illustrates only substrate 11, prior to subsequent steps being taken to deposit material layers and apply processing techniques to create a stressed fin-FET device.

Referring to FIG. 1(C-C), a cross section of the initial semiconductor structure of FIG. 1 is shown, taken normal to the fin 13, through the intended gate region of the resulting fin-FET device. The fin 13 is disposed on the substrate 11 and has a hard mask layer 12 disposed on a top surface of the fin 13. Also shown, is the intended channel region 14 of the fin 13 once subsequent steps are taken to create a fin-FET device.

Similarly, FIG. 1(D-D) illustrates a cross section of the initial semiconductor structure of FIG. 1, taken normal to the fin, but through the intended source-drain region of the resulting fin-FET device. FIG. 1(D-D) also shows the fin 13 disposed on the substrate 11, with a hard mask layer 12 disposed on a top surface of the fin 13, as well as the intended channel region 14 of the fin 13, prior to subsequent steps being taken to deposit material layers and apply processing techniques to create a stressed fin-FET device.

In a preferred embodiment of the present invention, the substrate 11 includes silicon (Si). However, the substrate 11 can include silicon oxide ($SiO_2$) having a thickness of 20 nm to 200 nm. The former is the material in a bulk-silicon embodiment, while the latter is the substrate material in a silicon-on-insulator embodiment. In either case, the fin 13 is preferably of Si, being of a length between 50 nm to several micrometers, a width between 5 to 20 nm and a height between 30 nm to 200 nm. The fin hard mask layer is preferably of silicon nitride (SiN), or other materials immune to the subsequent processing techniques applied to create the resulting fin-FET device, having a thickness of between 5 nm to 50 nm and material properties such that the fin 13 is protected during those steps Reference is made here after to FIGS. 2-3(D-D), which illustrate an embodiment of the present invention, in particular an embodiment for fabricating a compressively stressed fin-FET device.

Referring to FIG. 2, a top-down view of an intermediate semiconductor structure is illustrated. The semiconductor structure shown is an intermediate structure of the present invention having had material layers disposed on the initial semiconductor structure 10 of FIG. 1. Outer isolation spacers 20 have been disposed on the substrate (not shown here), along with a first shallow trench isolation region 23, and a second shallow trench isolation region 24. A gate structure has been disposed on a central portion of the fin 13 and fin hard mask layer 12. The gate structure having a gate hard mask layer 28, gate spacers 29, a gate dielectric (not shown), and a gate electrode (not shown). A first fin sidewall spacer 21 and a second fin sidewall spacer 22 have been disposed on upper portions of opposite sides of the semiconductor fin (not shown). Four cross sections, A-A, B-B, C-C, and D-D, are shown in FIG. 2, and will here after be utilized to describe embodiments of the present invention.

Referring to FIG. 2(A-A), a cross section view of the intermediate semiconductor structure, through the fin 13, is illustrated. The channel region 14 extends through the length of the fin, underneath the gate structure 25. The gate structure 25 having a gate hard mask layer 27, gate spacers 29, gate dielectric 26 and gate electrode 27, is disposed on the fin 13. The fin hard mask layer 12 is illustrated as being between the gate structure 25 and the top surface of the fin 13, however in alternative embodiments the fin hard mask layer can be disposed on the fin 13 such that the fin hard mask layer 12 is on either side of the gate structure 25 in order to have the gate structure 25 in contact with the top surface of the fin 13.

Referring to FIG. 2(B-B), a cross section view of the intermediate semiconductor structure, parallel to the fin and through the trench region of the semiconductor structure, is illustrated. The second shallow trench isolation region 24 is disposed on the substrate 11, with the gate structure 25 disposed on the second shallow trench isolation region 24.

Referring to FIG. 2(C-C), a cross section view of the intermediate semiconductor structure, normal to the fin and through the gate region of the semiconductor structure, is illustrated. The first shallow trench isolation region 23 and the second shallow trench isolation region 24 are disposed on semiconductor structure such that each is in contact with the substrate 11 and an opposite side wall of the fin 13. The gate dielectric 26 is disposed on the semiconductor structure such that it is in contact with the sidewalls of the fin 13, the fin hard mask layer 12 and the shallow trench isolation regions 23 and 24. The gate electrode 27 and the gate hard mask 28 are disposed such that the gate electrode is above the entirety of the gate region of the fin and runs the width of the semiconductor structure.

Referring to FIG. 2(D-D), a cross section view of the intermediate semiconductor structure, normal to the fin and through the source/drain region of the semiconductor structure, is illustrated. The first fin side wall spacer 21 is disposed on the semiconductor structure such that it is in contact with the first sidewall of the fin 13, the fin hard mask layer 12 and the first shallow trench isolation region 23, thereby collectively covering the first side wall of the fin 13. Similarly, the second fin side wall spacer 22 is disposed on the semiconductor structure such that it is in contact with the second sidewall of the fin 13, the fin hard mask layer 12 and the second shallow trench isolation region 24, thereby collectively covering the second side wall of the fin 13.

In a preferred embodiment of the present invention, the first and second shallow trench isolation regions 23, 24, are formed by depositing silicon dioxide to a thickness of 50 nm to 200 nm by a method such as chemical vapor deposition (CVD), followed by chemical mechanical polishing (CMP), and recessing the oxide layer to reveal the top portion of the fin by a method such as reactive ion etching (RIE), as known in the art of fin-FET fabrication. These regions are preferably of materials that a subsequent oxidation process can successfully diffuse oxygen through in order to reach those areas of the fin 13 that are intended to be oxidized into stressors. The gate structure is preferably formed on the semiconductor fin 13 and the fin hard mask layer 12 by techniques known in the art such as CVD, atomic layer deposition (ALD), or plasma-enhanced chemical vapor deposition (PECVD) followed by patterning the structure using lithography and etching. The gate dielectric 26 is preferably of $SiO_2$ or other suitable dielectric such as a high-k dielectric and thickness ranging from 1 nm to 5 nm; the gate electrode 27 is preferably poly silicon, a work-function metal, such as TiN, TaN, TiC, other suitable gate materials, or combinations thereof as are known in the art and is preferably 20 nm to 200 nm thick; the gate hard mask layer 28 is preferably of SiN of a vertical thickness 20 nm to 100 nm; and the gate spacers 29 are preferably 5 nm to 20 nm thick horizontally and of SiN or other materials impervious to subsequent processes, such as rapid thermal oxidation, in order to keep the regions of the structure covered by those layers from being affected by such subsequent processes. The fin sidewall spacers 21, 22 are formed by CVD, ALD, or PECVD to deposit a conformal layer of fin sidewall spacer dielectric, followed by a RIE process to remove portions of the fin sidewall spacer dielectric formed on horizontal surfaces and also are preferably of SiN or other materials that subsequent processes, particularly oxidation processes, cannot diffuse through in order to keep the upper region of the fin 13 from being subjected to such processes, and as such are preferably 3 nm to 10 nm thick horizontally.

Figure 3:
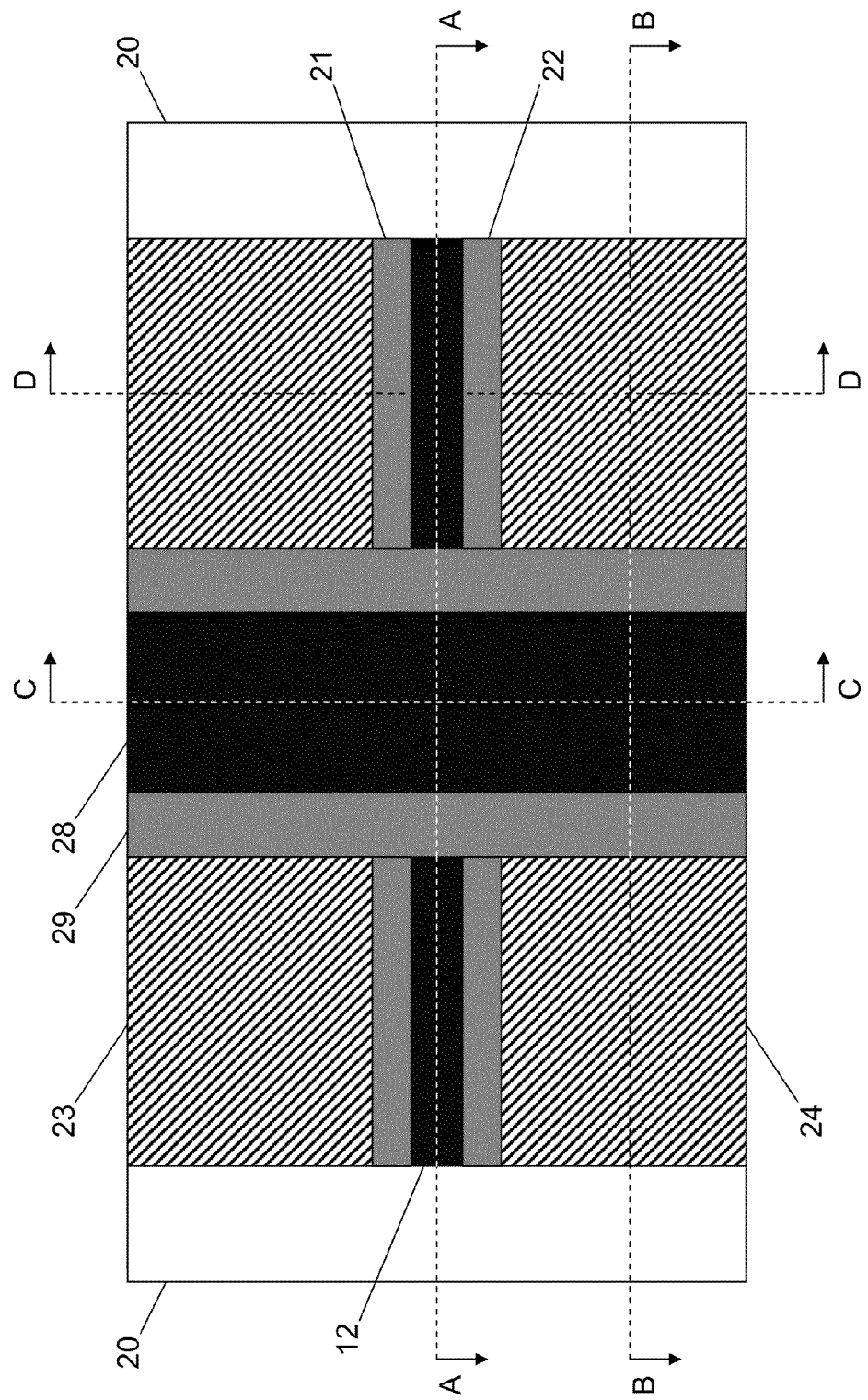
FIG. 3 illustrates a top view of the semiconductor fin structure of an embodiment of the present invention following formation of oxide stressors within the fin of the intermediate semiconductor structure of FIG. 2.

Referring to FIG. 3, a top down view of a stressed fin-FET structure is illustrated. In a preferred embodiment of the present invention, the intermediate structure of FIG. 4 has been subject to oxidation such as rapid thermal oxidation or furnace oxidation characterized by temperature of 800° C. to 1100° C., pressure of 1 atm to 10 atm, duration of 10 s to 10 min, although lesser or greater values are possible. Because of the materials selected for elements of the semiconductor structure, oxygen diffuses only into those portions of the first shallow trench isolation region 23 and the second shallow trench isolation region 24, that are visible in FIG. 3, i.e. are not covered by the gate hard mask 28, the gate spacers 29, the fin hard mask 12 or the fin sidewall spacers 21, 22, all of which are impervious to the oxidation process. The oxidation process diffuses oxygen through these portions of the shallow trench isolation regions 23, 24, which allow the oxygen to reach those areas of the fin 13 immediately below the fin side wall spacers 21, 22, and oxidize those areas through the width of the fin 13 by exposing those areas to the oxidation process at both side walls of the fin 13. Oxidizing the fin causes those areas to expand in volume, thereby creating oxide stressors 31, 32, which exert pressure vertically on the portion of the fin directly above the spacers. The volume expansion is due to the fact that $SiO_2$ has a molar volume roughly 120% larger that that of crystalline Si. By selectively applying pressure vertically on the outer portions of the upper region of fin 13, while the center portion of the fin 13 remains static, compressive stress is induced within the channel 14 of the fin 13. Accordingly, the fin 13 is stressed in a compressive manner without the foot print of the semiconductor structure being increased and without having to apply techniques vastly different from those disclosed below for inducing tensile stress within the fin 13.

Referring to FIG. 3(A-A), a cross section, through the fin of the stressed semiconductor structure of FIG. 3, is illustrated. Stressors 31 and 32 have been formed through the oxidation process. The stressors 31 and 32 are separated from the top surface of fin 13 due to the side wall spacers 21, 22, which were in contact with the upper side walls of the fin 13 during the oxidation process. The stressors 31 and 32 are also separated by a central portion of the fin 13 that was shielded from the oxidation process by the gate hard mask 28 and the gate spacers 29. As a result the expanded volumes of the fin 13 that form the spacers 31, 32, exert pressure vertically, as indicated by the arrows. By causing force to be applied vertically on both outer portions of the fin 13, as indicated by the arrows, compressive stress is induced within the channel 14 of the fin 13.

Referring to FIG. 3(B-B), a cross section, parallel to the fin and through the trench region of the oxidized semiconductor structure is illustrated. Because of the shielding affect provided by the gate hard mask 28 and the gate spacers 29, oxygen diffuses through those portions of the shallow trench isolation region 24 that are on either side of the gate structure 25, which blocks the oxidation from affecting the central portion of the fin 13.

Referring to FIG. 3(C-C) a cross section, normal to the fin and through the gate region of the semiconductor structure, is illustrated. As described above, because the gate hard mask 28 includes material resistant to oxidation processes, the oxidation process is not able to diffuse oxygen to the area of the fin 13 directly below the hard mask 28.

Referring to FIG. 3(D-D) a cross section, normal to the fin and through the source/drain region of the semiconductor structure, is illustrated. As described above, the portions of the first shallow trench isolation region 23 and the second shallow trench isolation region 24 that are exposed to the oxidation process, permit oxygen to diffuse through and reach the fin 13. As a result only those outer portions of the fin not protected by material impervious to the oxidation process were oxidized and expanded to form stressors 31 (not shown here) and stressor 32. The stressor, having been exposed to oxygen diffusing from both sides of the fin 13, is formed throughout the width of the fin 13, and exerts pressure vertically as indicated by the arrows. This vertical pressure is only exerted at the outer portions of the fin 13, thereby inducing compressive stress within the channel 14.

Figure 4:
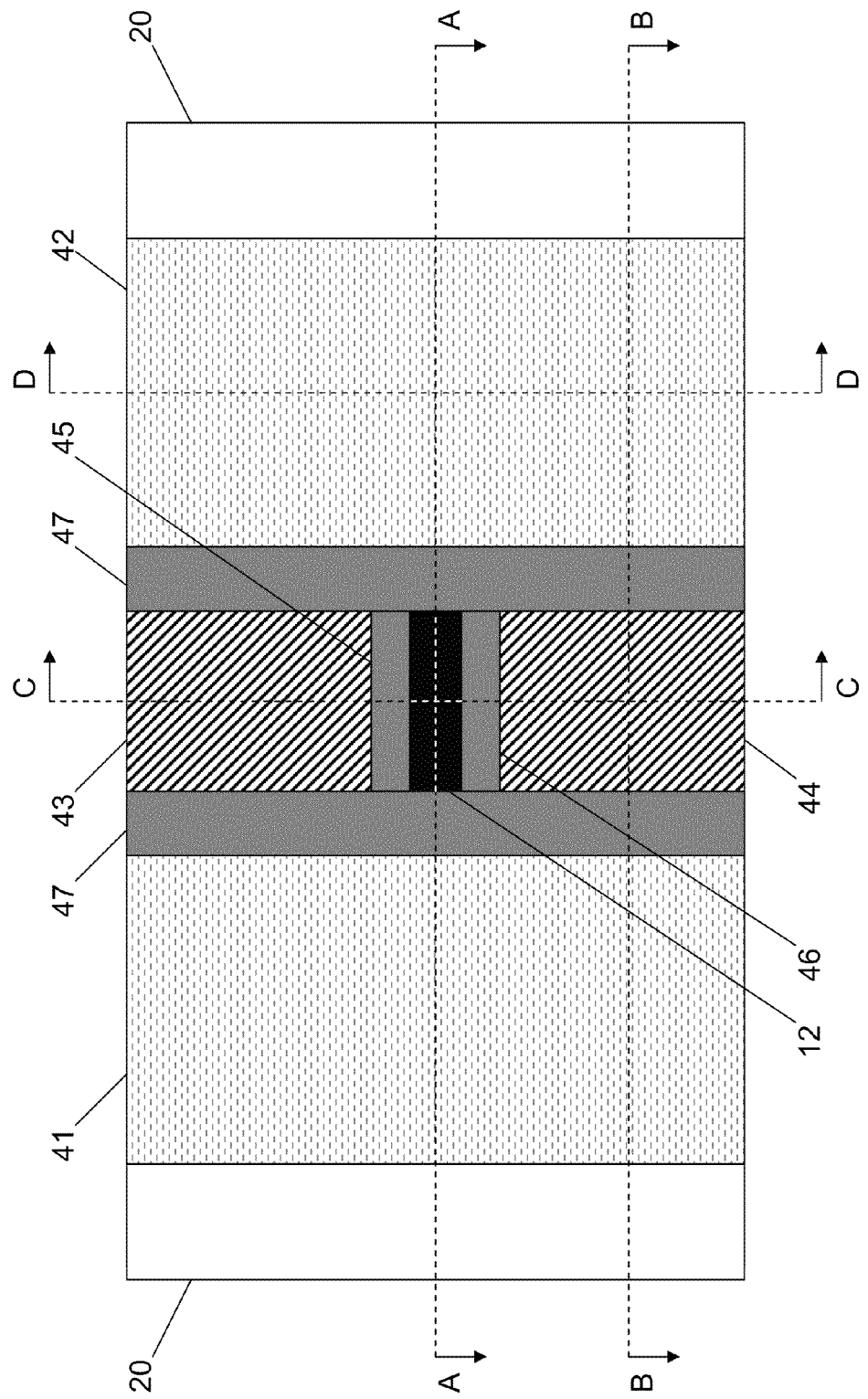
FIG. 4 illustrates a top view of an intermediate semiconductor fin structure of the present invention following formation of shallow trench isolation regions, outer isolation regions, fin spacers, a dummy gate, inter-layer dielectric regions, and subsequent removal of the dummy gate on the initial semiconductor structure of FIG. 1.
Figure 5:
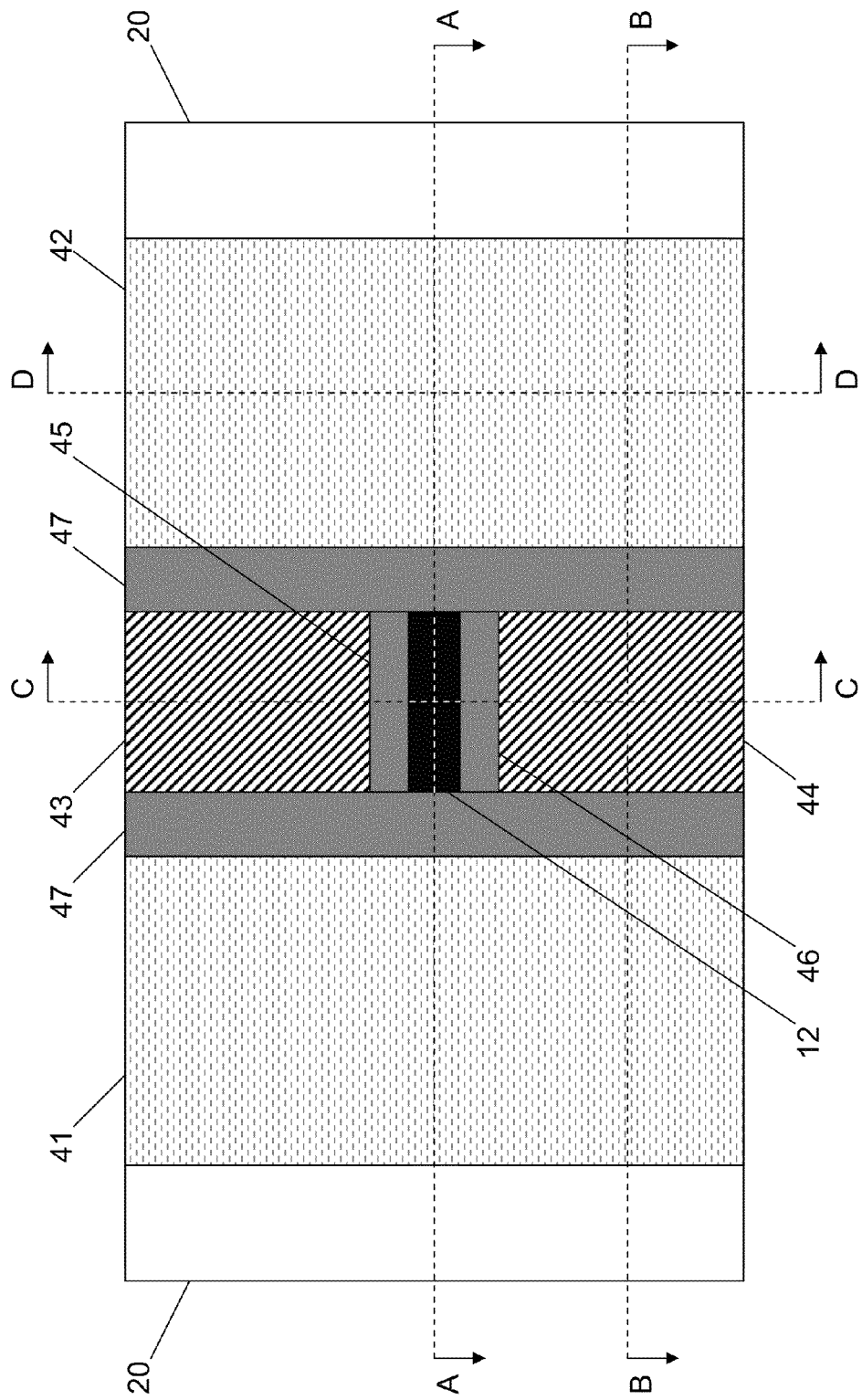
FIG. 5 illustrates a top view of the semiconductor fin structure of an embodiment of the present invention following formation of an oxide stressor within a central portion of the fin of the intermediate semiconductor structure of FIG. 4, thereby inducing tensile stress within the channel of the fin.

Reference is made here after to FIG. 4-5(D-D), which illustrate an embodiment of the present invention, particularly a semiconductor structure having a tensile stressed channel.

Referring to FIG. 4, a top-down view of an intermediate semiconductor structure is illustrated. The semiconductor structure shown is an intermediate structure within the present invention having had material layers disposed there on the initial structure as illustrated in FIG. 1. Outer isolation spacers 20 have been disposed on substrate 11 (not shown), along with a first shallow trench isolation region 43 and a second shallow trench isolation region 44. A first fin sidewall spacer 45 and a second fin sidewall spacer 46 have been disposed on the fin 13 (not shown). A dummy gate structure (not shown) has been disposed on a central portion of the fin 13 and fin hard mask 12, and subsequently removed, leaving behind gate spacers 47. A first inter-layer dielectric 41 has been disposed on a first outer portion of the fin 13 (not shown) and semiconductor structure, and a second inter-layer dielectric 42 has been disposed on a second outer portion of the fin 13 (not shown) and semiconductor structure. Four cross section A-A, B-B, C-C, and D-D are illustrated within FIG. 4 and will here after be utilized to describe embodiments of the present invention.

Referring to FIG. 4(A-A), a cross section through the fin of the intermediate semiconductor structure of FIG. 4, is illustrated. The channel region 14 extends through the length of the fin, underneath the gap between the gate spacers 47 that were left by the removal of a dummy gate. A first inter-layer dielectric spacer 41 has been disposed on a first outer portion of the intermediate semiconductor structure, and a second inter-layer dielectric spacer 42 has been disposed on a second outer portion of the intermediate semiconductor structure. The fin hard mask layer 12 is illustrated as being between the gate spacers 47 and the top surface of the fin 13, as well as between the inter-layer dielectric layers 41, 42, and the top surface of the fin 13.

Referring to FIG. 4(B-B), a cross section parallel to the fin and through the trench region of the intermediate semiconductor structure of FIG. 4, is illustrated. The second shallow trench isolation region 44 is disposed on the substrate 11. The first inter layer dielectric spacer 41 is disposed on a first outer portion of the semiconductor structure and the second inter layer dielectric spacer 42 is disposed on a second outer portion of the semiconductor structure. After the dummy gate has been removed, gate spacers 47 remain disposed on the second shallow trench isolation region 44 within a central portion of the semiconductor structure.

Referring to FIG. 4(C-C), a cross section normal to the fin and through the gate region of the intermediate semiconductor structure of FIG. 4, is illustrated. The first shallow trench isolation region 43 is disposed on the substrate 11 such that it is in contact with a lower portion of the fin 13. The second shallow trench isolation region 44 is disposed on the substrate 11 such that it is in contact with a lower portion of the fin 13. The first fin side wall spacer 45 is disposed on the semiconductor structure such that it is in contact with an upper portion of the first sidewall of the fin 13, the fin hard mask layer 12 and the first shallow trench isolation region 43, thereby collectively covering the first side wall of the fin 13. Similarly, the second fin side wall spacer 46 is disposed on the semiconductor structure such that it is in contact with an upper portion of the second sidewall of the fin 13, the fin hard mask layer 12 and the second shallow trench isolation region 24, thereby collectively covering the second side wall of the fin 13.

Referring to FIG. 4(D-D), a cross section normal to the fin and through the source/drain region of the intermediate structure of FIG. 4 is illustrated. Similar to FIG. 4(C-C), the shallow trench isolation regions 43, 44, are disposed on the substrate 11, such that they are in contact with a lower portion of the opposite sidewalls of the fin 13 and fin spacers 45, 46 are disposed on opposite side walls of the fin 13. The second inter-layer dielectric spacer 42 is disposed on the intermediate semiconductor structure such that it covers the shallow trench isolation regions 43, 44, the fin spacers 45, 46, and the fin hard mask 12.

In a preferred embodiment of the present invention the first shallow trench isolation region 43 and the second shallow trench isolation region 44 are formed on the substrate 11 of the initial semiconductor structure by CVD or PECVD to a vertical thickness of 50 nm to 200 nm, followed by CMP and recess. Next the first fin spacer 45 and the second fin spacer 46 are respectively formed on a first sidewall and a second sidewall of fin 13 by CVD, ALD, or PECVD of SiN followed by RIE to a horizontal thickness of 3 nm to 10 nm_such that the first fin spacer 45 and the second fin spacer 46 each are in contact with a respective first shallow trench isolation region 43 and a second shallow trench isolation region 44, as well as in contact with a respective first sidewall of the fin hard mask 12 and a second sidewall of the fin hard mask 12, thereby respectively covering a first upper portion of the fin 13 and a second upper portion of the fin 13. A dummy gate is then formed on a central portion of the semiconductor structure such that it is in contact with a central portion of the first and second shallow trench isolation regions 43, 44, the first and second fin spacers 45, 46, and the fin hard mask 12. The dummy gate structure includes gate spacers 47, formed by CVD, PECVD, or ALD, to a horizontal thickness of 5 nm to 20 nm. Following formation of the dummy gate structure, the first and second inter dielectric layers 41, 42, are respectively formed on a first and second outer portion of the semiconductor structure by CVD or PECVD of silicon dioxide to a vertical thickness of about 200 nm, followed by CMP such that each is in contact with the shallow trench isolation regions 43, 44, the fin spacers 45, 46, and the fin hard mask 12. Next the dummy gate structure is removed by RIE process such that the gate spacers 47 remain, leaving the central portion of the shallow trench isolation regions 43, 44, the fin spacers 45, 46 and the fin hard mask 12 open to the surrounding fabrication environment.

Referring to FIG. 5, a top-down view of a stressed fin-FET is illustrated. In a preferred embodiment of the present invention, the intermediate structure of FIG. 4 has been subject to an oxidation process such as rapid thermal oxidation or furnace oxidation characterized by temperature ranging from 800oC to 1100oC, pressure ranging from 1 atm to 10 atm, duration from 10 s to 10 min. During the oxidation process oxygen diffuses through the central portion of the shallow trench isolation layers of $SiO_2$, while blocked by the fin hard mask 12 of SiN and the fin spacers 45, 46 of SiN. Oxygen reaches the central portions of the fin 13 that are in contact with the shallow trench isolation layers, and thereby oxidizes those areas throughout the width of the lower central portion of the fin 13. This causes an expansion in volume of the area of the fin 13 that is oxidized, which forms a stressor 51 of $SiO_2$ within the lower central portion of the fin 13. Because of the expansion in volume, the stressor 51 exerts pressure on the surrounding fin 13, particularly in a vertical manner on the upper portion of the fin 13 directly above the stressor 51. The collective action of applying vertical pressure only on the central portion of the fin 13 while the outer portions of the fin 13 remain static, causes tensile stress to be induced within the channel 14 of the fin 13. Accordingly, the fin 13 is stressed in a tensile manner without the foot print of the semiconductor structure being increased and without having to apply techniques vastly different from those disclosed above for inducing compressive stress within the fin 13.

Referring to FIG. 5(A-A), a cross section, through the fin 13 of the stressed semiconductor structure of FIG. 5, is illustrated. Stressor 51 has been formed through the oxidation process. The stressor 51 is separated from the top surface of fin 13 due to the side wall spacers 45, 46, shielding the upper side walls of the fin 13 from the oxidation process. The stressor 51 is also separated from the ends of the fin 13 by the outer portions of the fin that were shielded from the oxidation process by the gate spacers 47 and the inter layer dielectric spacers 41, 42. Accordingly, the inter layer dielectric regions 41, 42, function to prevent the oxidation process from reaching those portions of fin 13 that are directly below the inter layer dielectric regions 41, 42.

Referring to FIG. 5(B-B), a cross section, parallel to the fin 13 and through the trench region of the stressed semiconductor structure of FIG. 5, is illustrated. While the inter layer dielectric regions 41, 42, can include materials impervious to the oxidation process, the inter layer dielectric regions 41, 42 are shown as being of a material that oxygen does diffuse into. As such each of the inter layer dielectric regions 41, 42 must have a sufficient depth (seen here) such that the oxygen cannot diffuse through the inter layer dielectric regions 41, 42 and through the outer portions of the shallow trench isolation regions 43, 44, to reach the fin 13 within the duration required for oxygen to diffuse through the central portion of the shallow trench isolation regions 43, 44, and form stressor 51.

Referring to FIG. 5(C-C), a cross section, normal to the fin 13 and through the gate region of the stressed semiconductor structure of FIG. 5, is illustrated. The dummy gate has been removed after formation of the inter layer dielectric regions 41, 42 such that the central portion of the fin 13 is separated from the fabrication environment by the fin hard mask 12, the fin spacers 21, 22, and the shallow trench isolation regions 23, 24. This formation permits oxygen to diffuse through the shallow trench isolation regions 23, 24, and oxidize the lower central portion of the fin 13, causing the oxidized area of the fin 13 to expand in volume, thereby forming stressor 51. The stressor 51, having been exposed to oxygen diffusing from both sides of the fin 13, is formed throughout the width of the fin 13, and exerts pressure vertically as indicated by the arrows. This vertical pressure is only exerted on the central upper portion of the fin 13, while the outer upper portions of the fin 13 remain static, thereby inducing tensile stress within the channel 14 of the fin 13.

Referring to FIG. 5(D-D), a cross section, normal to the fin 13 and through the source/drain region of the stressed semiconductor structure of FIG. 5, is illustrated. The second inter layer dielectric region 42 is formed across the width of the second outer portion of the semiconductor structure, to a depth sufficient to prevent the oxidation process from diffusing oxygen through the second inter layer dielectric region 42, and through the first and second shallow trench isolation regions 43, 44, to reach the lower portion of the fin 13 directly below the second inter layer dielectric region 42.

Figure 6:
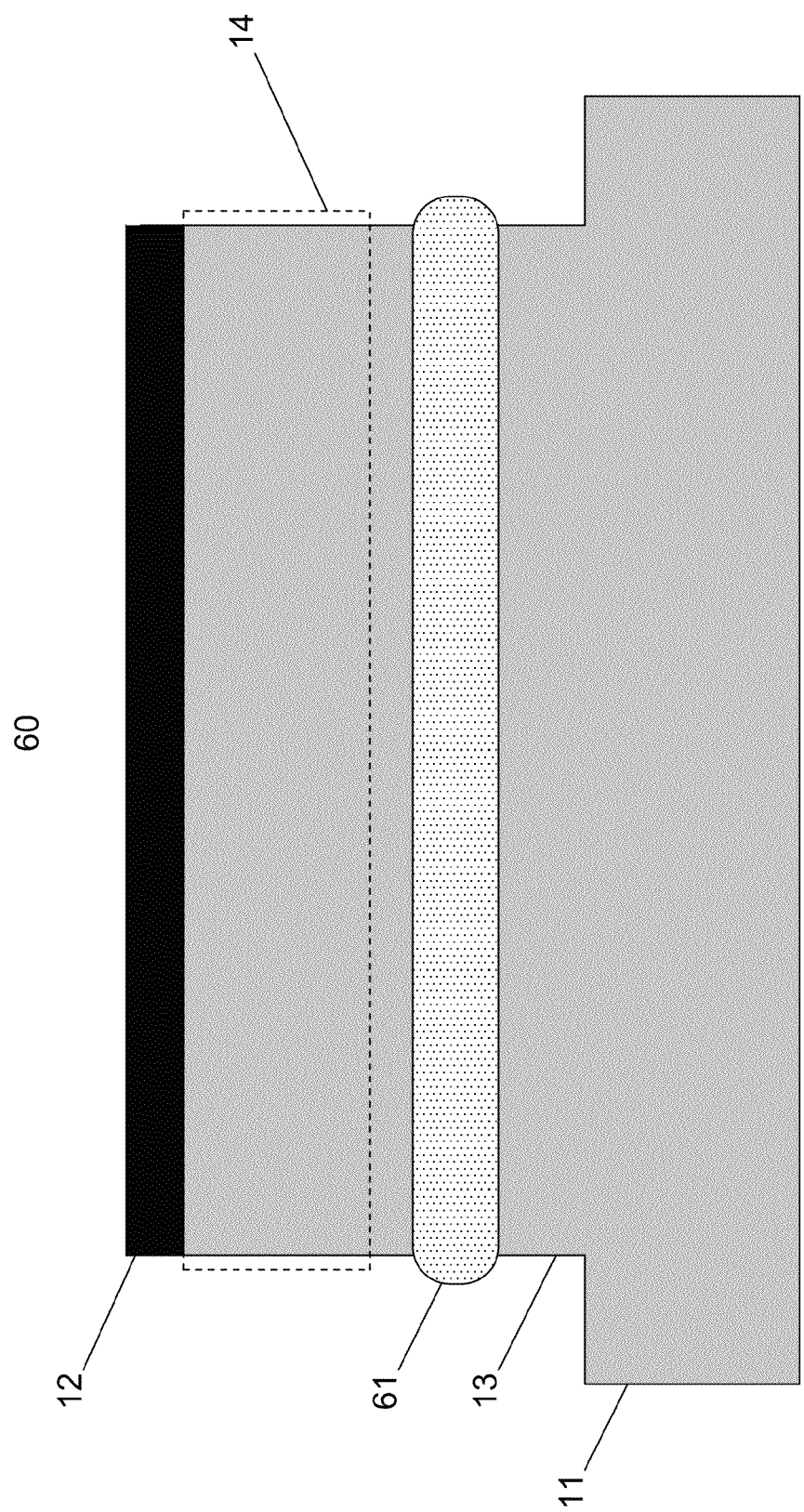
FIG. 6 illustrates a cross section through the fin of an alternative initial semiconductor structure that has a fin isolation region formed throughout the width and length of the fin.

Referring to FIG. 6, an initial semiconductor structure 60 of an alternative embodiment of the present invention is illustrated in cross section through the fin 13. A fin isolation region 61 is formed throughout the width and throughout the length of the fin 13, by wafer bonding, oxidation of the bottom portion of the fins, or forming a dummy semiconductor layer such as SiGe and replacing it with a dielectric as known in the art. By doing so, the active region of the fin 13 is isolated from the substrate 11 and any other fins that can also be formed on the substrate 11.

Figure 6A:
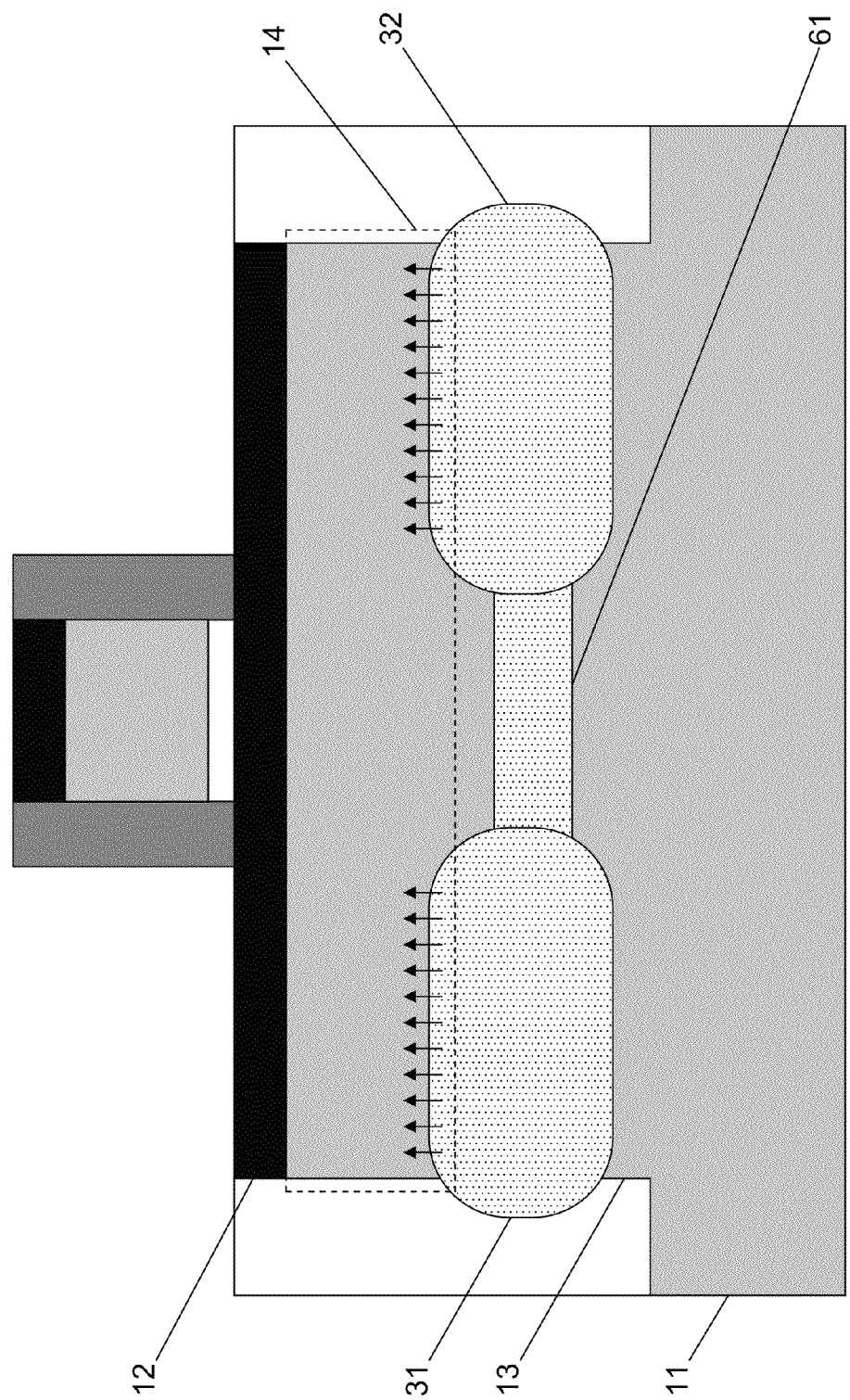
FIG. 6A illustrates a cross section through the fin of an embodiment of the present invention that has had multiple oxide stressors formed within the outer portions of the fin of the alternative initial semiconductor structure of FIG. 6, thereby inducing compressive stress within the channel of the fin of FIG. 6.

Referring to FIG. 6A, an alternative embodiment of a stressed semiconductor structure is illustrated in cross section through the fin 13 of the initial semiconductor structure 60. The present invention is carried out on the alternative initial semiconductor structure 60 of FIG. 6, forming a first oxide stressor 31 and a second oxide stressor 32, thereby inducing compressive stress within the channel 14 of the fin 13.

Figure 6B:
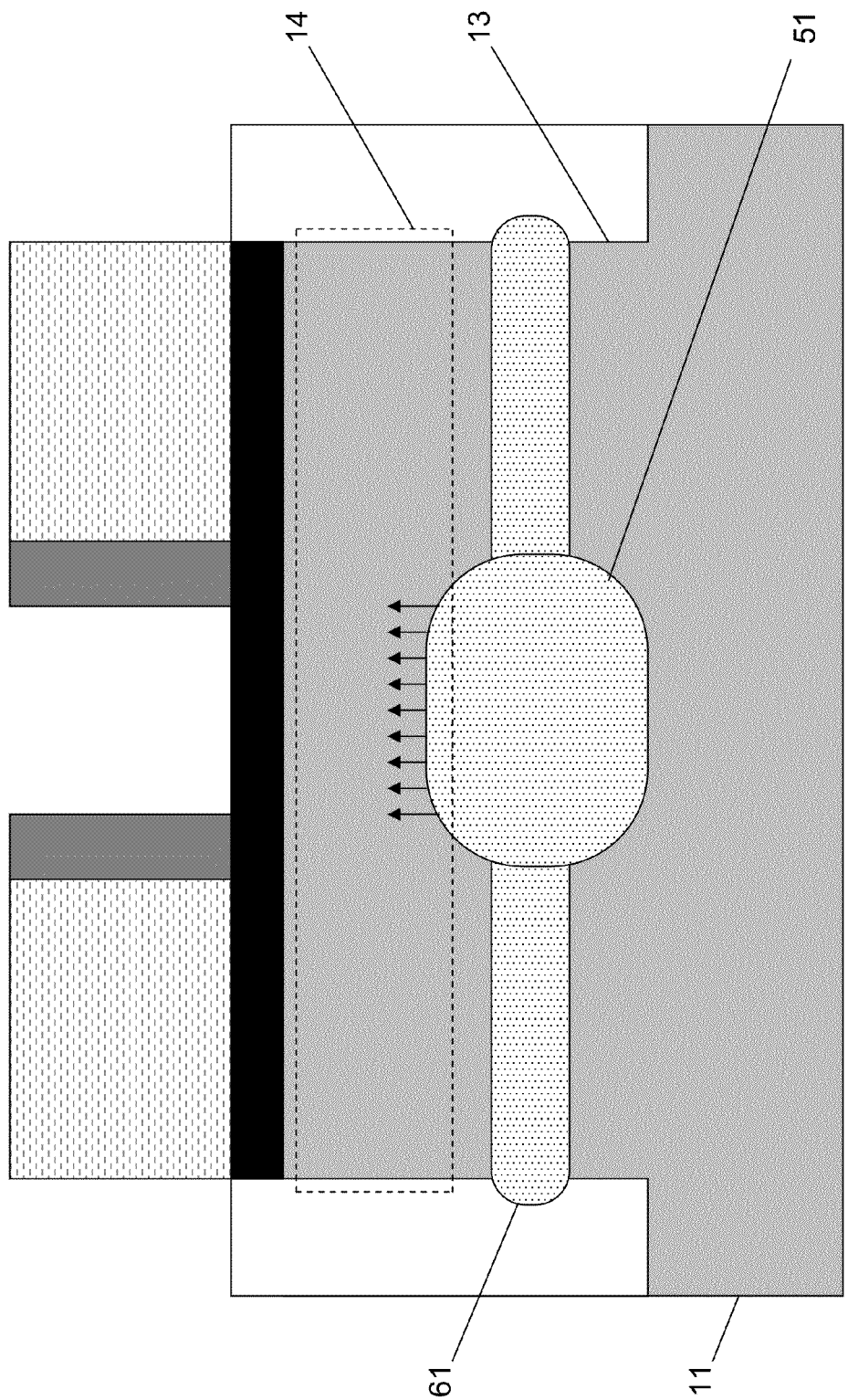
FIG. 6B illustrates a cross section through the fin of an embodiment of the present invention that has had an oxide stressor formed within a central portion of the fin of the alternative initial semiconductor structure of FIG. 6, thereby inducing tensile stress within the channel of the fin of FIG. 6.

Referring to FIG. 6B, an alternative embodiment of a stressed semiconductor structure is illustrated in cross section through the fin 13 of the alternative initial semiconductor structure 60. The present invention is carried out on the alternative initial semiconductor structure 60 of FIG. 6, forming an oxide stressor 51 that exerts vertical pressure (indicated by the arrows) on the upper portion of the fin 13, thereby inducing tensile stress within the channel 14 of the fin 13.

The semiconductor material of fin 13 and substrate 11 can be any semiconductor material, either doped or undoped, including but not limited to silicon, silicon germanium, germanium, silicon carbide, a III-V compound semiconductor, a II-VI compound semiconductor, a carbon-based semiconductor such as a carbon nanotube or graphene, an organic semiconductor, or any multilayer or other combination of these. In an alternative embodiment, the initial semiconductor structure includes a semiconductor-on-insulator (SOI), rather than of bulk silicon.

It will be apparent to those skilled in the art having regard to this disclosure that other modifications of the present invention beyond those embodiments specifically described here can be made without departing from the spirit of the invention. For example, the semiconductor devices and layered structures described above can include additional optional layers and the methods for fabricating such devices and structures can include additional optional steps for depositing such layers. Accordingly, such modifications are considered within the scope of the present invention as limited solely by the appended claims.

What is claimed is:

1. A method for constructing a semiconductor fin structure having a compressive stressed channel, the method comprising:
    forming a semiconductor fin on a substrate;
    forming a fin hard mask layer on a top surface of the semiconductor fin;
    forming a first isolation region on a lower portion of a first side wall of the semiconductor fin;
    forming a second isolation region on a lower portion of a second side wall of the semiconductor fin;
    forming a first fin spacer on an upper portion of the first side wall of the semiconductor fin;
    forming a second fin spacer on an upper portion of the second side wall of the semiconductor fin;
    forming a gate structure on a center portion of the semiconductor fin;
    oxidizing a first lower outer region of the semiconductor fin through the width of the fin to create a first oxide stressor that is separated from the top surface of the semiconductor fin by an upper portion of the semiconductor fin; and
    oxidizing a second lower outer region of the semiconductor fin through the width of the semiconductor fin to create a second oxide stressor that is separated from the top surface of the semiconductor fin by an upper portion of the fin, and separated from the first stressor by the center portion of the semiconductor fin;
    wherein oxidizing the first lower outer region causes the first lower outer region to expand thereby forming the first oxide stressor, which exerts vertical pressure on the upper portion of the semiconductor fin directly above the first stressor;
    wherein oxidizing the second lower outer region causes the second lower outer region to expand thereby forming the second oxide stressor, which exerts vertical pressure on the upper portion of the semiconductor fin directly above the second stressor; and
    wherein the first oxide stressor and the second oxide stressor collectively induce compressive stress within a channel of the semiconductor fin.

2. The method according to claim 1, further comprising:
    forming a fin isolation region through the width of the fin and through the length of the fin.

3. The method according to claim 1, wherein the gate structure is in contact with a center portion of the top surface of the semiconductor fin.

4. The method according to claim 1, wherein:
    the first isolation region is permeable by oxygen;
    the second isolation region is permeable by oxygen;
    the fin hard mask layer is not permeable by oxygen;
    the first fin spacer is not permeable by oxygen;
    the second fin spacer is not permeable by oxygen; and
    the gate structure is not permeable by oxygen.

5. The method according to claim 4, wherein:
    the first isolation region comprises silicon dioxide ($SiO_2$);
    the second isolation region comprises silicon dioxide ($SiO_2$);
    the fin hard mask layer comprises silicon nitride (SiN);
    the first fin spacer comprises silicon nitride (SiN); and
    the second fin spacer comprises silicon nitride (SiN).

6. The method according to claim 1, wherein the fin hard mask layer is not formed on a central portion of the top surface of the semiconductor fin.

7. The method according to claim 6, wherein the gate structure is in contact with a center portion of a top surface of the fin hard mask layer.

8. A semiconductor fin structure having a compressive stressed channel, the semiconductor fin structure comprising:
    a semiconductor fin having a channel;
    a first oxide stressor formed through the width of the semiconductor fin, separated from a top surface of the semiconductor fin by an upper portion of the semiconductor fin; and
    a second oxide stressor formed through the width of the semiconductor fin, separated from a top surface of the semiconductor fin by an upper portion of the semiconductor fin, and separated from the first stressor by a center portion of the semiconductor fin;
    wherein the first oxide stressor exerts vertical pressure on the upper portion of the semiconductor fin directly above the first oxide stressor, and the second oxide stressor exerts vertical pressure on the upper portion of the semiconductor fin directly above the second oxide stressor, such that the first oxide stressor and the second oxide stressor collectively induce compressive stress within the channel of the semiconductor fin.

9. The structure according to claim 8, further comprising:
a fin isolation region formed through the width of the semiconductor fin and formed through the length of the semiconductor fin.

10. The structure according to claim 8, further comprising:
a gate structure disposed on the semiconductor fin.

11. The structure according to claim 10, wherein the gate structure is in contact with a top surface of the semiconductor fin, a first side wall of the semiconductor fin, and a second side wall of the semiconductor fin.

12. The structure according to claim 10 further comprising:
a fin hard mask layer formed in contact with the top surface of the semiconductor fin.

* * * * *